US006855961B2

(12) United States Patent
Maruyama et al.

(10) Patent No.: US 6,855,961 B2
(45) Date of Patent: Feb. 15, 2005

(54) DISPLAY DEVICE AND MANUFACTURING METHOD THEREOF

(75) Inventors: Junya Maruyama, Kanagawa (JP); Masahiro Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/131,435

(22) Filed: Apr. 24, 2002

(65) Prior Publication Data

US 2002/0187575 A1 Dec. 12, 2002

(30) Foreign Application Priority Data

Apr. 27, 2001 (JP) ........................................ 2001-133285

(51) Int. Cl.$^7$ ............................................. H01L 33/00
(52) U.S. Cl. ........................................................ 257/99
(58) Field of Search ................................ 257/79, 80, 81, 257/82, 98, 99, 100; 438/455, 456, 457, 458, 26, 27, 33, 116, 118; 345/33, 39, 40

(56) References Cited

U.S. PATENT DOCUMENTS

| | | | | |
|---|---|---|---|---|
| 4,994,139 A | * | 2/1991 | Biermann et al. | 156/630 |
| 4,997,792 A | * | 3/1991 | McClurg | 437/226 |
| 5,711,824 A | | 1/1998 | Shinohara et al. | 136/259 |
| 5,834,893 A | | 11/1998 | Bulovic et al. | 313/506 |
| 5,891,264 A | | 4/1999 | Shinohara et al. | 136/261 |
| 5,962,962 A | | 10/1999 | Fujita et al. | 313/412 |
| 6,049,167 A | | 4/2000 | Onitsuka et al. | 313/512 |
| 6,056,614 A | | 5/2000 | Adachi | 445/24 |
| 6,111,357 A | * | 8/2000 | Fleming et al. | 313/509 |
| 6,284,342 B1 | | 9/2001 | Ebisawa et al. | 428/69 |
| 6,433,487 B1 | | 8/2002 | Yamazaki et al. | 315/169.3 |
| 6,525,339 B2 | * | 2/2003 | Motomatsu | 257/40 |
| 6,614,057 B2 | * | 9/2003 | Silvernail et al. | 257/99 |
| 6,633,121 B2 | * | 10/2003 | Eida et al. | 313/504 |
| 2002/0149320 A1 | | 10/2002 | Maruyama et al. | 315/169.3 |

FOREIGN PATENT DOCUMENTS

| | | |
|---|---|---|
| JP | 9-069642 | 3/1997 |
| JP | 9-180639 | 7/1997 |
| JP | 10-144927 | 5/1998 |
| JP | 2000-173766 | 6/2000 |

OTHER PUBLICATIONS

Tohma T., "Development of Organic El Display using Small Molecule Material," Proceedings of the 10$^{th}$ International Workshop on Inorganic and Organic Electroluminescence, Hamamatsu, Japan, Dec. 4–7, 2000, pp. 9–13.

English abstract re Japanese Patent Application No. JP 2000–173766, published Jun. 23, 2000.

English abstract re Japanese Patent Application No. JP 10–144927, published May 29, 1998.

English abstract re Japanese Patent Application No. JP 9–069642, published Mar. 11, 1997.

English Abstract re Japanese Patent Application No. 9–180639 published Jul. 11, 1997.

* cited by examiner

Primary Examiner—Kamand Cuneo
Assistant Examiner—Scott B. Geyer
(74) Attorney, Agent, or Firm—Cook, Alex, McFarron, Manzo, Cummings & Mehler Ltd.

(57) ABSTRACT

A technique for obtaining light emitting devices manufactured with high yield is provided. The width of a seal pattern (605b) can be kept thin by manufacturing a light emitting device using a second substrate (600a) which has a concave portion (607a) and a concave portion (608a). It therefore becomes possible to make the light emitting device have a narrow frame. In addition, the light emitting device with the narrow frame can be realized by a manufacturing method thereof in which a portion of the second substrate from the concave portion to an edge surface is cut.

27 Claims, 21 Drawing Sheets

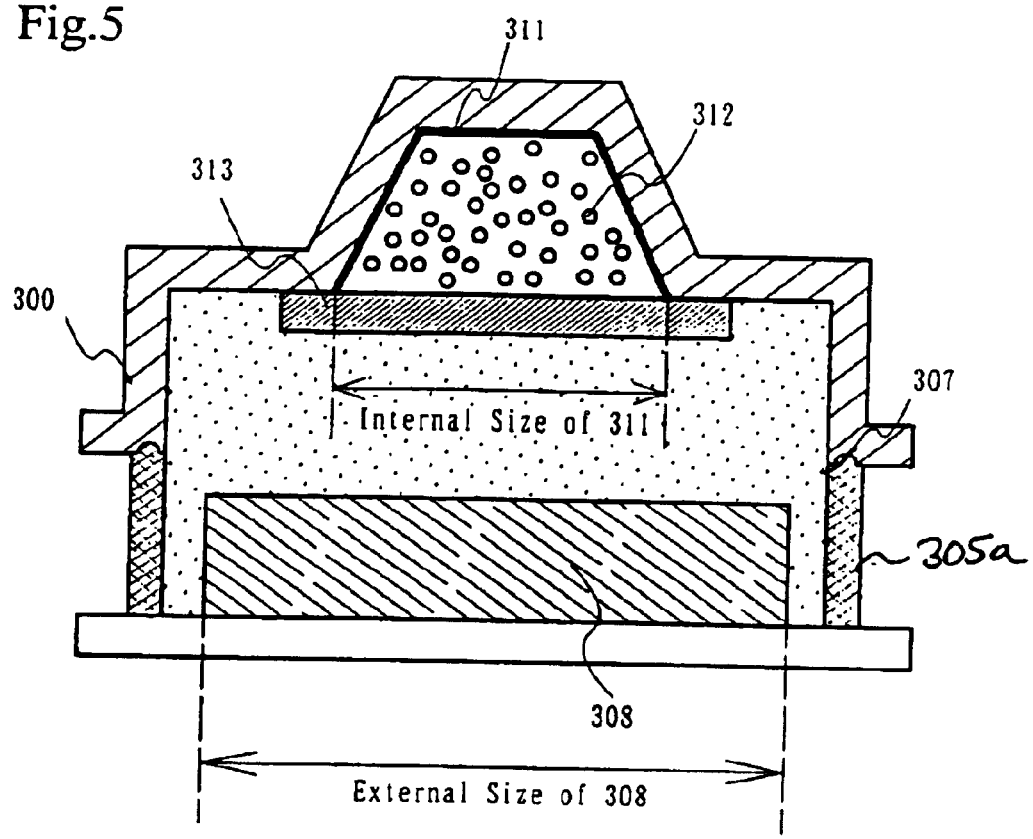

Direction of Light

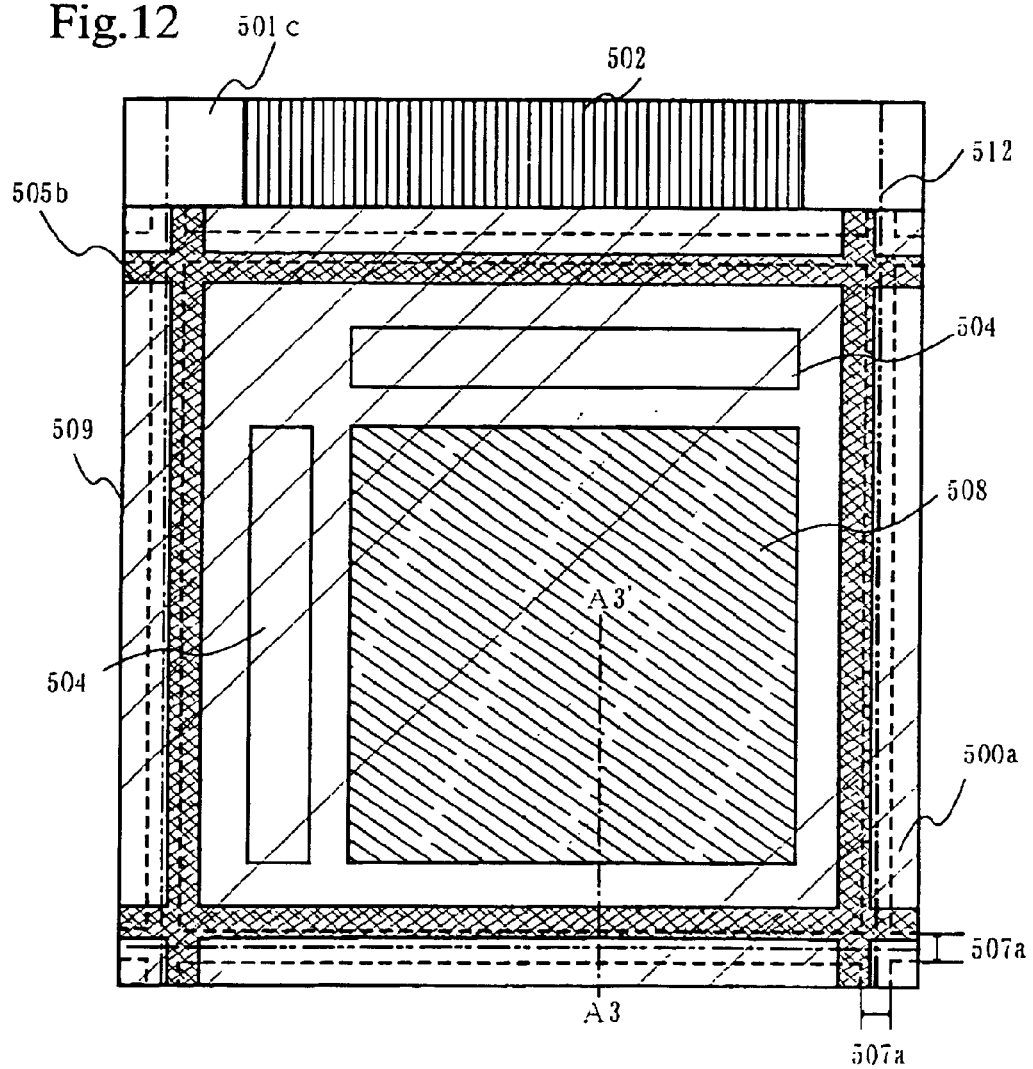

Direction of Light

Width of Seal Pattern

Distance between 1208 and 1211

DISPLAY DEVICE AND MANUFACTURING METHOD THEREOF

BACKGROUND OF THE INVENTION

1. Field of the Invention

The present invention relates to a light emitting device using an element which has a light emitting material sandwiched between two electrodes (hereafter referred to as "light emitting elements"). Specifically, the present invention relates to a technique for making a light emitting device with a narrower frame.

2. Description of the Related Art

The development of a light emitting device using a light emitting element has advanced in recent years. The light emitting device does not require a backlight such as used in a liquid crystal display since the light emitting element has the ability of self-light emission. It therefore becomes possible to make light emitting devices thinner and lighter. In addition, the light emitting devices can have a wide angle of view, and therefore they are suitable for outdoor use.

There are two types of light emitting devices, a passive type (simple matrix type) and an active type (active matrix type), and the development of both types is flourishing. In particular, active matrix light emitting devices are in the spotlight at present. Further, there are organic and inorganic materials for the materials that are used in the light emitting layers of the light emitting elements. Furthermore, organic materials are divided into low molecular weight organic materials and high molecular weight (polymer) organic materials, and both types are being researched at a feverish pace. Low molecular weight organic materials are formed mainly by vacuum evaporation, and high molecular weight organic materials are mainly formed by a method such as spin coating or ink jet printing.

Compared to inorganic materials, organic materials have high light emission efficiency, and can be driven at a low voltage. Further, in organic compounds, it is possible to design and make various types of new substances. Thus, there is a possibility of discovering an element that emits light at higher efficiency in accordance with future developments in material design.

An example of a light emitting device in which seepage of a sealing material has developed is shown in FIGS. 20A and 20B. FIG. 20A is a cross sectional diagram of a device in which seepage of a sealing material has developed, cut along a dotted line segment A–A', and FIG. 20B is an upper surface diagram of the device. A light emitting element 1208 is composed of an anode 1202, an organic layer 1203, and a cathode 1204, and is formed so that the organic layer 1203 is sandwiched by the anode 1202 and the cathode 1204. Although the anode or the cathode may be formed directly on a first substrate 1201, the anode is in general formed on the first substrate 1201 due to ease of manufacture. Electrons injected from the cathode and holes injected from the anode recombine at light emitting centers of the organic layer 1203 to form excitons, and the excitons emit energy for emitting light in returning to a base state. Further, a wiring portion 1209 and a driver circuit 1212 are formed on the first substrate 1201. The wiring portion is a gathering of wirings that are electrically connected to the driver circuit. Although not shown in the figures, the driver circuit 1212 and the light emitting element 1208 are also electrically connected by wirings.

Sealing of the light emitting element is described next. At present, a method of sealing by using a sealing can or a glass substrate has been devised. For present-day product panels, a drying agent is placed into a metallic sealing can, an adhesive material is applied on the periphery of the sealing can, and the adhesive is hardened, to perform sealing (refer to "Organic EL and Display", CMC, p. 250, 2001). The sealing can and the glass substrate are both referred to as a second substrate 1200. Further, the adhesive material corresponds to a sealing material. That is, the sealing material is applied to the second substrate 1200, and the first substrate 1201 and the second substrate 1200 are bonded through a seal pattern 1205. The sealing material bonds the first substrate and the second substrate, is a bonding and sealing material for enclosing the light emitting elements therebetween, and is disposed in a peripheral portion of the panel. The seal pattern is regulated by the shape, position, and width of the sealing material. The light emitting element 1208 is in a sealed space surrounded by the first substrate 1201, the second substrate 1200, the seal pattern 1205, and the driver circuit 1212. Light emitting elements deteriorate due to moisture and oxygen, and therefore the sealed space is filled with an inert gas 1206 (molecular nitrogen or a noble gas). In this specification, a region surrounded by the first substrate, the second substrate, the seal pattern, and the light emitting element is referred to as a closed space. In addition, in this specification, the first substrate refers to the substrate on which the light emitting element is formed, and the second substrate refers to the substrate bonded to the first substrate through the seal pattern in order to protect the light emitting element, which easily deteriorates due to moisture and oxygen. A drying agent is omitted from being shown in the figures.

As shown in FIGS. 20A and 20B, the light emitting device has structure in which the first substrate 1201 on which the light emitting element is formed, and the second substrate 1200 are bonded through the seal pattern 1205. The sealing material is pushed down upon and spreads out after bonding the second substrate 1200, on which the seal pattern 1205 is formed by applying the sealing material, and the first substrate 1201, and the width of the seal pattern 1205 becomes greater. The term "display portion" corresponds to a region of the light emitting element as seen from a normal direction to the first substrate in this specification. There has been a case in which there occurs expansion of a seal pattern (see page of a sealing material) 1207 from an area where the seal pattern is to be formed and the seal pattern leaks out onto the display portion of a display or onto edge faces of the substrate.

The following can be considered to be causes of seepage of the sealing material in liquid crystal display devices. The temperature of the panel is generally increased to a temperature between 150 and 200° C. by a thermal pressing after the process of bonding the first substrate and the second substrate to proceed a hardening reaction, and the temperature of the panel is reduced to a room temperature when hardening is complete. The viscosity of the sealing material becomes lower at a temperature of 150 to 200° C. immediately before the hardening reaction begins, and the sealing material is in a very fluid state. The sealing material therefore flows out through any portions in which even a slight gap between the first substrate and the second substrate exists due to capillary action. In addition, the hardening reaction begins as time elapses, therefore the viscosity of the sealing material increases rapidly, and the sealing material that has once spread out will not return to its prior state, instead to harden as is.

It may be difficult to perform sectioning a portion of the first substrate or the second substrate near the seal pattern formed between the first substrate and the second substrate. This interferes with the technique of making the light emitting device into a light emitting device with a narrower frame. Making a narrower frame means to make the distance between the light emitting element 1208 and an edge face 1211 smaller. Further, regulation of the amount of the sealing material applied can be considered for simply making the width of the seal pattern narrower in order to achieve a narrower frame of a display. However, making the width of the seal pattern thinner can also cause a reduction in the bond strength between the first substrate and the second substrate, as well as seal peeling. In order to perform precise control of the amount of the sealing material applied, a high cost dispenser apparatus (seal drawings apparatus) for performing control of the substrate gap is required.

In recent years, small size displays have been in demand for portable devices such as portable telephones while high definition is desired in order to display dynamic images. It is necessary to make the resolution higher (the number of pixels becomes greater), and to reduce the pixel pitch in order to have higher definition. However, a pixel pitch may be on the order of 300 μm, for example, in displaying a character, and therefore, the number of pixels must be increased in order to have higher definition, which requires increasing the proportion occupied by the display portion in the portable device. Making a narrower frame is thus a significant object.

In recent years, small size displays have been in demand for portable devices such as portable telephones while high definition is desired in order to display dynamic images. It is necessary to make the resolution higher (the number of pixels becomes greater), and to reduce the pixel pitch in order to have higher definition. However, a pixel pitch may be on the order of 300 μm, for example, in displaying a character, and therefore, the number of pixels must be increased in order to have higher definition, which requires to increase the proportion occupied by the display portion in the portable device. Making a narrower frame is thus a significant object

SUMMARY OF THE INVENTION

An object of the present invention is therefore to provide a light emitting device which is capable of suppressing the reduction in bond strength between a first substrate and a second substrate, even if the width of a seal pattern is narrow in order to achieve a narrower frame. In addition, an object of the present invention is to provide a sturdy light emitting device in which a portion of the seal pattern is formed on an edge portion of the second substrate. In this specification, the term "edge portion" denotes a face of the first substrate or the second substrate, specifically a portion at which a surface or an edge surface contacts a concave portion. The terms "front surface of the first substrate" and "front surface of the second substrate" denote faces in contact with the seal pattern in this specification. Further, the terms "rear surface of the first substrate" and "rear surface of the second substrate" denote surfaces except the concave portion, the edge surface, and the surface in contact with the seal pattern in this specification.

A concave portion is formed in a portion to which a sealing material is to be applied and at which a seal pattern is to be formed, in a second substrate of a light emitting device. The area through which the seal pattern and the second substrate contact becomes large provided that a substrate with a concave portion is used, even while a narrow width of the formed seal pattern is maintained, thus to provide an effect of suppressing reductions in the bond strength between a first substrate and the second substrate. The distance between the seal pattern and a scribe line to be formed can be reduced, and therefore it becomes possible to make the light emitting device into a light emitting device with a narrow frame. Furthermore, the sealing material that flows out fluidly during thermal pressing can accumulate in the concave portion by forming a portion of the seal pattern in a portion of the concave portion of the second substrate. Seepage of the sealing material during bonding of the first substrate and the second substrate can therefore be controlled, and a light emitting device with a narrow frame becomes possible. Note that it is preferable that the thermal pressing process for hardening the seal pattern be performed with the first substrate placed over top of the second substrate. The depth of the concave portion may be approximately a half of the thickness of the substrate. A scribe line may be possibly provided as a substitute for the concave portion. However, while the width of a scribe line formed in a substrate 2200 shown in FIG. 21 is approximately 50 μm, and its depth is approximately 20 μm, a material with an approximately ball shape (filler material) is mixed into the sealing material to increase the apparent viscosity. The average particle size of the filler material is approximately 3 μm at minimum, and therefore the scribe line is not large enough to sufficiently control seepage of the sealing material. In addition, a first substrate on which a scribe line is formed in the rear surface or the front surface is prepared in the case in which the sealing material is applied with the regulated amount so that a portion of the sealing material is formed in the concave portion. The first substrate and the second substrate are bonded so that the concave portion and the scribe line overlap as seen from a normal direction to the first substrate or the second substrate. It becomes possible to cause cracks to form from the concave portion and from the scribe line by using a brake bar of a brake machine. The concave portion plays the role of a scribe line, and therefore it is not necessary to include a step of forming a new scribe line. A portion of the seal pattern is formed on the edge portion of the second substrate after cutting, and therefore it becomes possible to provide a sturdy light emitting device. A single concave portion or a plurality of concave portions may be formed on the second substrate.

Therefore, a structure of the present invention disclosed in this specification is a light emitting device which has a first substrate, a light emitting element formed on the first substrate, and a sealing material formed in the periphery of the light emitting element, in which the first substrate is bonded through the sealing material to a second substrate in which a concave portion is formed, and the sealing material fills the concave portion. It becomes possible to suppress reductions in the bond strength between the first substrate and the second substrate even if the width of the seal pattern is made narrower in the case of using the light emitting device of the present invention since the area for contact between the seal pattern and the concave portion becomes larger by forming the concave portion in the second substrate.

Further, another structure of the present invention is a light emitting device which has a first substrate, a light emitting device formed on the first substrate, and a seal pattern formed in the periphery of the light emitting element, in which the first substrate is bonded through the seal pattern to a second substrate in which a concave portion is formed, and a portion of the seal pattern is formed in a portion of the concave portion. It becomes possible to suppress reductions in the bond strength between the first substrate and the second substrate in the case of using the light emitting device of the present invention since the surface of contact between the seal pattern and the concave portion becomes larger by forming the concave portion in the second substrate. Further, in the case of using the light emitting device of the present invention, even if the amount of the sealing material applied from a dispenser becomes large, the sealing material can accumulate in the concave portion, expansion of the width of the seal pattern can be prevented, and the distance between the light emitting element and an edge surface can be made shorter.

Also, another structure of the present invention is a light emitting device which has a first substrate that has a portion of a scribe line, a light emitting element formed on the first substrate, and a seal pattern formed in the periphery of the light emitting element, in which the first substrate is bonded through the seal pattern to a second substrate in which a concave portion is formed, and a portion of the seal pattern is formed in a portion of the concave portion. The light emitting device of the present invention is manufactured as follows: the first substrate on which the scribe line is formed is prepared, and the first substrate and the second substrate are bonded together so that the concave portion and the scribe line overlap as seen from a normal direction to the first substrate or the second substrate, and cracks are made to develop from the concave portion and the scribe line. In the case of using the light emitting device of the present invention, the area over through which the seal pattern and the concave portion contact becomes larger by forming the concave portion in the second substrate, and it becomes possible to suppress reductions in the bond strength between the first substrate and the second substrate. Further, even if the amount of the sealing material applied from a dispenser becomes large in the case of using the light emitting device of the present invention, the sealing material can accumulate in the concave portion, and therefore expansion of the width of the seal pattern can be suppressed. In addition, a portion of the seal pattern is formed on an edge portion of the second substrate, and it becomes possible to provide a sturdy light emitting device by using the light emitting device of the present invention.

Furthermore, another structure of the present invention is a light emitting device which has a first substrate, a light emitting element formed on the first substrate, and a sealing material formed in the periphery of the light emitting element, in which the first substrate is bonded through the sealing material to a second substrate in which concave portions are formed, and the sealing material fills at least one of the concave portions. It becomes possible to suppress reductions in the bond strength between the first substrate and the second substrate in the case of using the light emitting device of the present invention even if the width of the seal pattern is made narrower since the area for contact between the seal pattern and the concave portion becomes large.

Further, another structure of the present invention is a light emitting device which has a first substrate, a light emitting device formed on the first substrate, and a seal pattern formed in the periphery of the light emitting element, in which the first substrate is bonded through the seal pattern to a second substrate in which a plurality of concave portions are formed, and a portion of the seal pattern is formed in at least one concave portion of the plurality of concave portions. It becomes possible to suppress reductions in the bond strength between the first substrate and the second substrate in the case of using the light emitting device of the present invention since the surface area for contact between the seal pattern and the concave portion becomes large by forming the concave portions in the second substrate. Further, even if the amount of the sealing material applied from a dispenser becomes large, the sealing material can accumulate in the concave portions, expansion of the width of the seal pattern can be suppressed, and the distance between the light emitting element and an edge surface can be made shorter.

Another structure of the present invention is a light emitting device which has a first substrate that has a portion of a scribe line, a light emitting element formed on the first substrate, and a seal pattern formed in the periphery of the light emitting element, in which the first substrate is bonded through the seal pattern to a second substrate in which a plurality of concave portions are formed, and a portion of the seal pattern is formed in at least one concave portion of the plurality of concave portions. The light emitting device of the present invention is manufactured as follows: the first substrate which has the scribe line formed on its rear surface or its front surface is prepared, and the first substrate and the second substrate are bonded together so that the concave portion and the scribe line overlap, and cracks are made to develop from the concave portion and the scribe line. In the case of using the light emitting device of the present invention, the area through which the seal pattern and the concave portion contact becomes large by forming the concave portions in the second substrate, and it becomes possible to suppress reductions in the bond strength between the first substrate and the second substrate. Further, even if the amount of the sealing material applied from a dispenser becomes large, the sealing material can accumulate in the concave portions, expansion the width of the seal pattern can be suppressed and the distance between the light emitting element and an edge surface can be made shorter. In addition, a portion of the seal pattern is formed on an edge portion of the second substrate, and it becomes possible to provide a sturdy light emitting device by using the light emitting device of the present invention.

BRIEF DESCRIPTION OF THE DRAWINGS

In the accompanying drawings:

FIG. 5 is a cross sectional diagram of a light emitting device of the present invention;

FIG. 12 is an upper surface diagram of a light emitting device of the present invention;

DETAILED DESCRIPTION OF THE PREFERRED EMBODIMENTS

[Embodiment Mode]

Figure 1A:
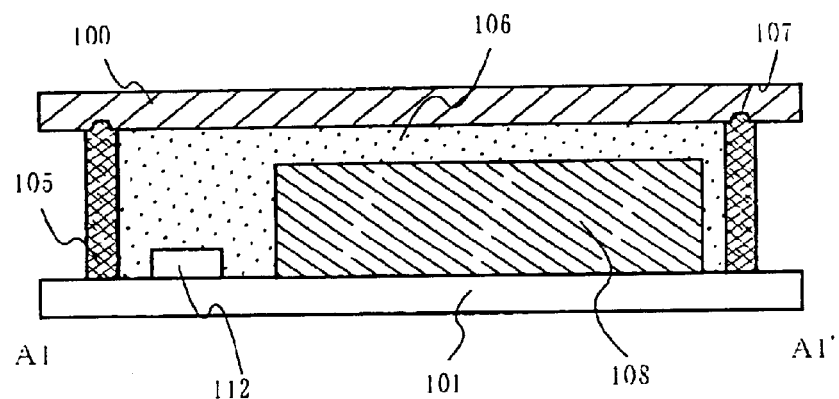
FIGS. 1A and 1B are a cross sectional diagram and an upper surface diagram. respectively, of a light emitting device of the present invention.
Figure 1B:
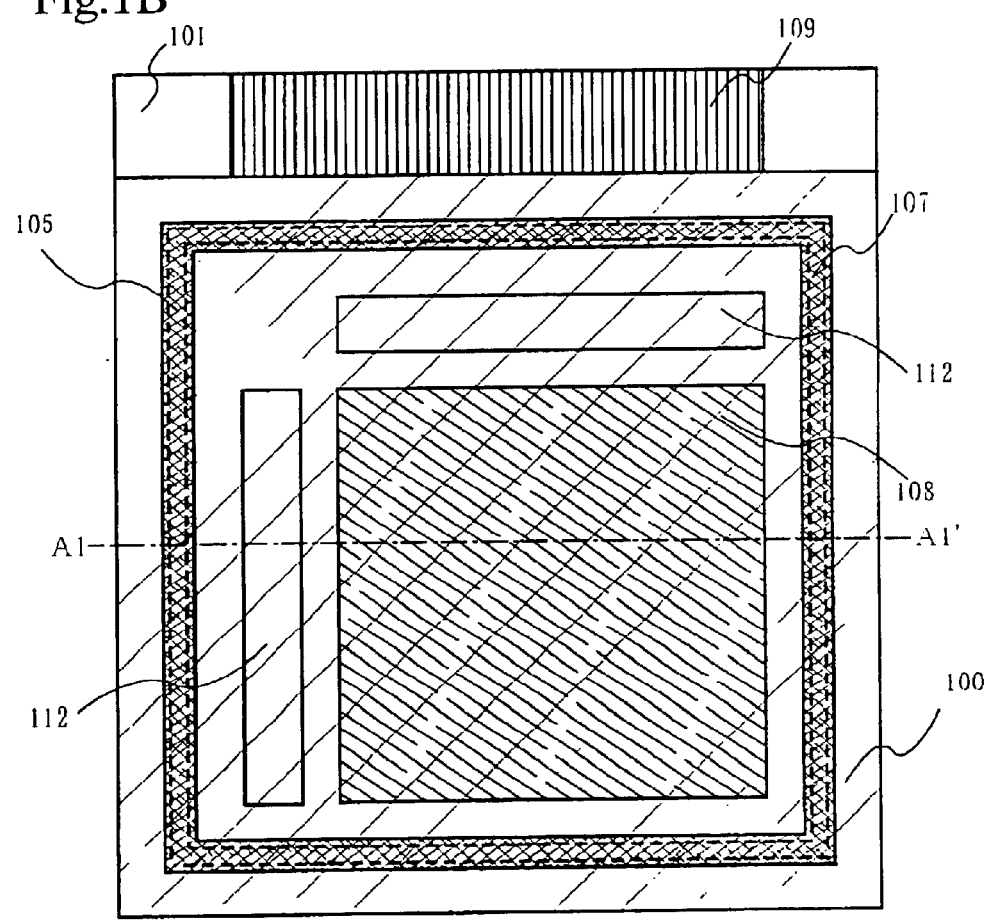

A method of manufacturing a light emitting device according to the present invention is explained. A cross sectional diagram of a light emitting device according to the present invention, along a dotted line segment A1–A1' of FIG. 1B, is shown in FIG. 1A, and an upper surface diagram thereof is shown in FIG. 1B.

A concave portion 107 is formed in a portion of a second substrate, in which a sealing material is applied and a seal pattern 105 in a later process is formed. Glass etching is performed as a method of forming the concave portion in a case in which glass is used as the second substrate.

The sealing material is applied to the second substrate 100 to form the seal pattern 105. Although a dispenser method is used as an application method in Embodiment Mode, a screen printing method may also be performed. The seal pattern 105 is formed in the concave portion 107 on the second substrate as shown in FIG. 1A, and in the periphery of a light emitting element 108 as shown in FIG. 1B.

It is preferable to use an insulating substance such as amorphous glass (such as borosilicate glass or quartz), crystallized glass, ceramic glass, glass, or a polymer as the second substrate 100 material. Further, organic resins (acrylic resin, styrene resin, polycarbonate resin, or epoxy resin), and polymer insulating substances of silicone resin polymer may also be used. Ceramics may also be used. Further, it is possible to use metallic materials such as stainless steel alloys provided that the sealing material is an insulator.

Epoxy resin, acrylate resin, and the like can be used as the sealing material. Thermally setting resins and optically setting resins can also be used as the sealing material. Note that it is desirable to use the sealing material through which as little moisture as possible can pass.

A glass substrate, a quartz substrate, or a plastic substrate is used as the material for a first substrate 101. In addition, a wiring portion 109, a light emitting element 108, and a driver circuit 112 are formed on the first substrate 101. The wiring portion is a gathering of wirings that are electrically connected to the driver circuit. Although not shown in the figures, the light emitting element 108 and the driver circuit 112 are electrically connected by wirings.

The second substrate 100 and the first substrate 101 on which the light emitting element 108 is formed are bonded. As to a method of bonding, stamps are attached to the second substrate 100 and the first substrate 101, positional alignment is performed by using a CCD (charge coupled device) camera, and bonding is performed. Bonding is performed within an inert gas (nitrogen or a noble gas) atmosphere in order to fill a closed space, in which the light emitting element is sealed, with an inert gas. The moisture concentration within the atmosphere is reduced to be as low as possible. Specifically, it is desirable that the moisture concentration be equal to or less than 1 ppm.

The sealing material is hardened after bonding the first substrate 101, on which the light emitting element 108 is formed, and the second substrate 100 through the seal pattern 105. The sealing material is hardened by thermal pressing if it is a thermally setting resin, or by ultraviolet irradiation with an ultraviolet lamp if the sealing material is an ultraviolet setting resin. It is necessary to exert caution whichever method is used in order not to damage the light emitting during hardening.

A crack is then formed in a location, at which the first substrate 101 and the second substrate 100 must be cut, by using a scribe machine after hardening of the sealing material is complete. A force is then applied to the opposite surface to the surface in which the crack is formed, to perform cutting into a desired size. An apparatus that applies a pressure and is referred to as a brake machine may also be used at this time.

The light emitting element according to the present invention is thus obtained by the above process steps. The area through which the seal pattern 105 and the concave portion 107 contact becomes large due to forming the concave portion in the second substrate. Therefore, in the light emitting device according to the present invention, it becomes possible to suppress reductions in the bond strength between the first substrate 101 and the second substrate 100, even in the case in which the width of the seal pattern 105 is made narrow.

Although etching is used as the method of forming the concave portion in the case in which the second substrate is glass, sand blasting may also be used and the glass may also be formed using a mold.

Further, a metallic plate may be formed by using a press or a mold if the metallic plate is used as the second substrate.

Although an inert gas 106 is filled into the closed space here, an organic resin may also be used.

Although the second substrate 100 of the light emitting device according to the present invention has a sheet shape, it is also possible to apply the present invention to a light emitting device in which a second substrate 300 has a concave portion 311 (bold line portion) with a smaller internal size than the external size of a light emitting element 308, and in which a drying agent 312 is sealed in the concave portion 311. A film 313 plays a role in confining the drying agent 312 in the concave portion 311. The area, through which a seal pattern 305 and the concave portion 307 contact, becomes large due to forming the concave portion in the second substrate. It thus becomes possible to suppress reductions in the bond strength between a first substrate 301 and the second substrate 300, even in the case in which the width of the seal pattern 305 is made narrow, in the light emitting device of the present invention. In addition, the drying agent 312 is sealed in the concave portion 311, and therefore it becomes possible to control deterioration of the light emitting element 308 due to moisture and oxygen.

A more detailed explanation of the present invention with the above structure is given by the embodiments shown below.

Embodiment

[Embodiment 1]

Figure 6A:
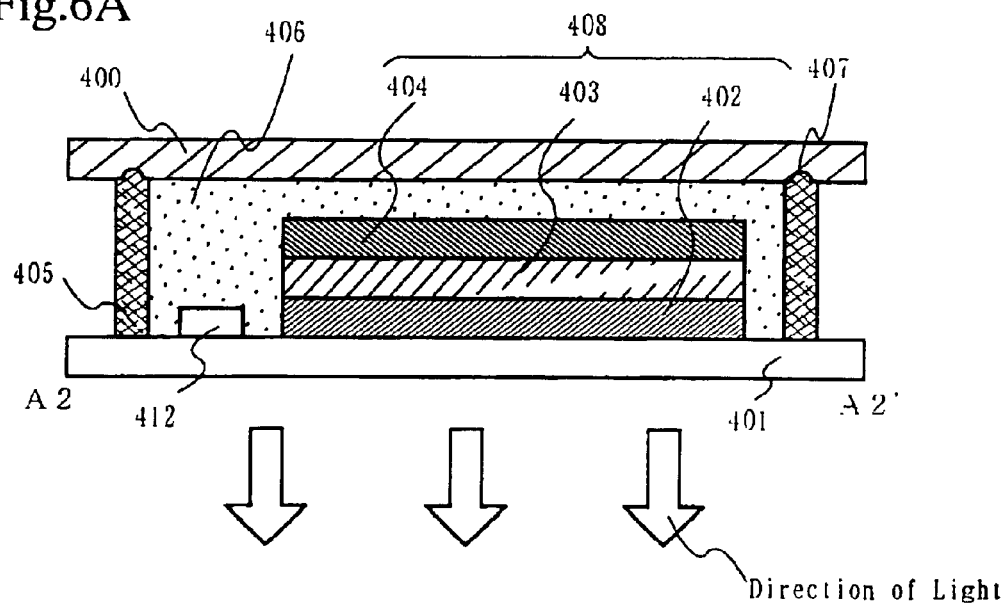
FIGS. 6A and 6B are a cross sectional diagram and an upper surface diagram, respectively, of a light emitting device of the present invention.
Figure 6B:
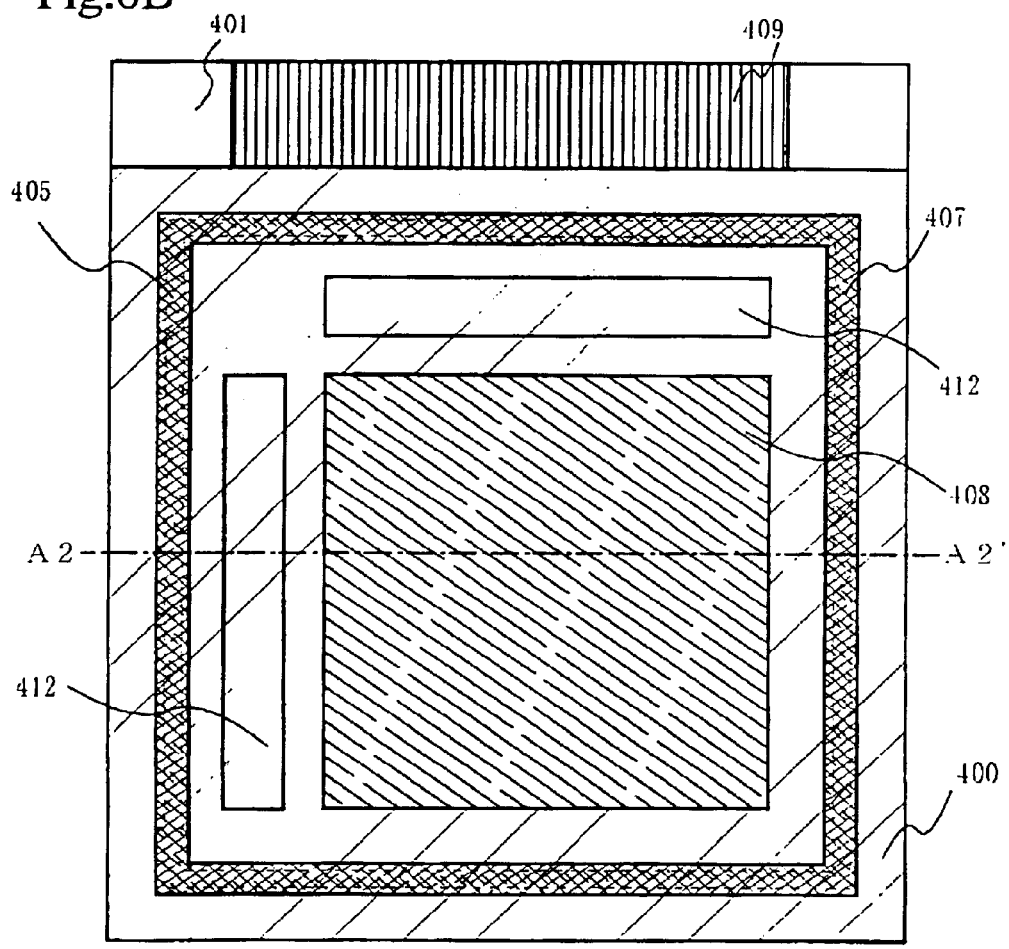

A light emitting device with lower surface emission, to which the present invention is applied, is shown in FIGS. 6A and 6B. The case, in which emitted light that passes through a first substrate 401, is referred to as "lower surface emission" in this specification. The direction of light is shown by an arrow. FIG. 6A is a cross sectional diagram of the light emitting device according to the present invention, cut along a dotted line segment A2–A2' in FIG. 6B, and FIG. 6B is an upper surface diagram of the light emitting device according to the present invention.

Figure 2A:
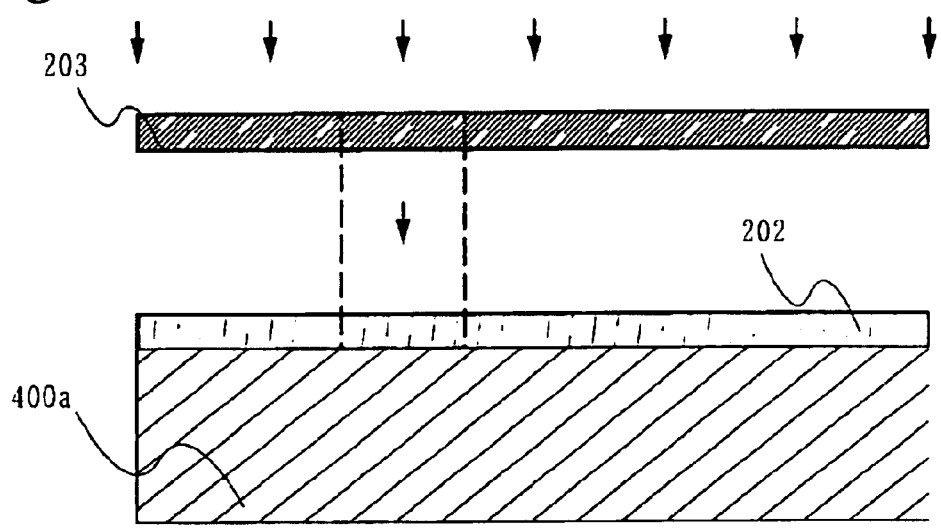
FIGS. 2A and 2B are diagrams showing a process of manufacturing a light emitting device of the present invention.
Figure 2B:
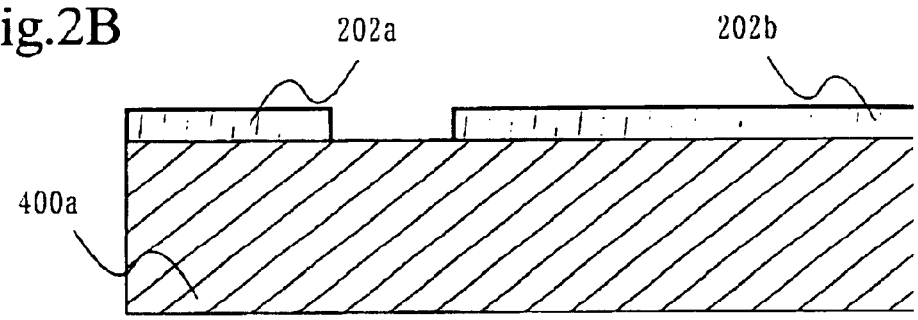
Figure 3A:
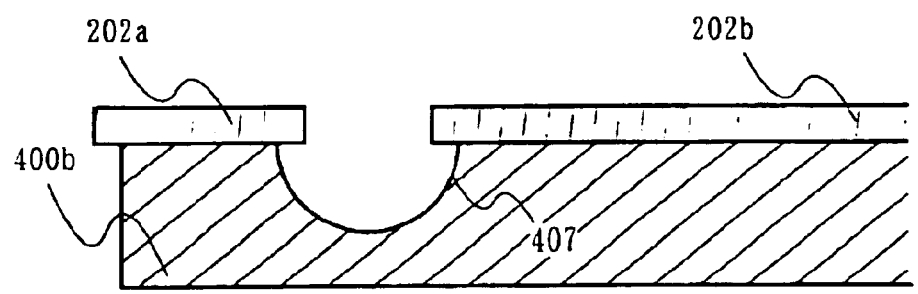
FIGS. 3A and 3B are diagrams showing a process of manufacturing a light emitting device of the present invention.
Figure 3B:
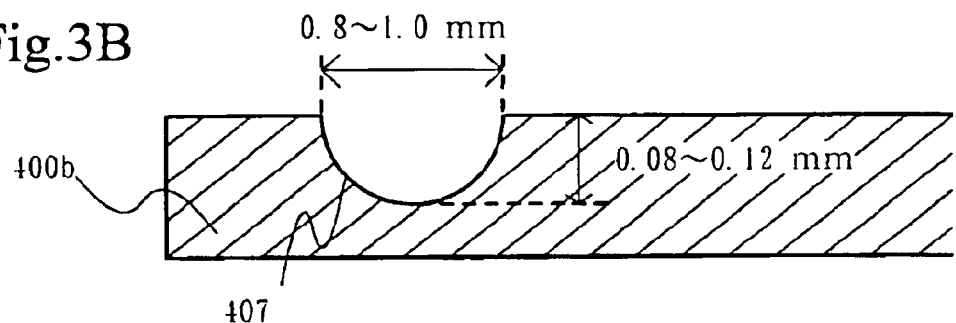

First, as shown in FIG. 2A, a resist 202 is formed by spin coating on a second substrate 400a made from glass. The resist 202 is then exposed to light using a mask 203 that can make a thinner resist pattern than the actual width of a seal pattern (resist application/exposure in FIG. 2A). Development is performed next as shown in FIG. 2B, and a portion of the resist for forming a concave portion is removed. On portions of the resist in which the concave portion is not formed, a resist 202a and a resist 202b remain on the second substrate 400a made from glass (development in FIG. 2B). Etching is then performed as shown in FIG. 3A to form a concave portion 407 in the second substrate 400a made from glass. Hydrofluoric acid, or a solution containing hydrofluoric acid as its main constituent, is used as an etchant. Etching is performed isotopically if wet etching is employed, and therefore, as shown in FIG. 3A, the shape after etching has a cross sectional shape that is a partially curved shape (etching in FIG. 3A). Next, the resist 202a and the resist 202b are peeled off, cleaning is performed, and a second substrate 400b made from glass in which the concave portion 407 is formed is obtained as shown in FIG. 3B. The second substrate 400b made from glass corresponds to the second substrate 400 of FIGS. 6A and 6B. The width of the concave portion 407 may be set to be 0.8 to 1.0 mm, and the depth of the concave portion 407 may be set in a range from 0.08 to 0.12 mm. The etching time may be regulated in order to control the depth of the concave portion 407 (peeling and cleaning in FIG. 3B).

On the other hand, a glass substrate, a quartz substrate, or a plastic substrate is used as the first substrate 401, as shown in FIGS. 6A and 6B. In addition, a wiring portion 409 and a driver circuit 412 are formed on the first substrate 401. The wiring portion is a gathering of wirings electrically connected to the driver circuit.

An anode 402 is then formed on the first substrate 401. A conductive film with a large work function, typically a transparent conductive film (such as a compound of indium oxide and tin oxide), platinum, gold, nickel, palladium, indium, or cobalt is used as a material of the anode 402. The anode is formed by a method such as sputtering or vacuum evaporation, and patterning is performed by photolithography.

An organic layer 403 is then formed on the anode 402 within an inert gas (nitrogen or a noble gas) atmosphere. Note that known materials can be used as the organic layer 403. A laminate structure is mainly used for the organic layer 403. The organic layer 403 is formed using materials such as hole injecting materials, hole transporting materials, materials that become light emitting layers, electron transporting materials, and electron injecting materials. Further, a material which is capable of converting energy, released in returning to a base state from a triplet excitation state, into light, may also be used in the organic layer 403.

A cathode 404 is formed on the organic layer 403 within an inert gas (nitrogen or a noble gas) atmosphere. The cathode 404 is formed by vacuum evaporation with a metal mask. A metal with a low work function, typically an element which belongs to group 1 or group 2 of the periodic table (magnesium, lithium, potassium, barium, calcium, sodium, and beryllium) or a metal with a work function near those of elements in the group 1 and group 2 is used as the cathode 404 material. Further, if aluminum is used as a material of the cathode, lithium fluoride or lithium acetylacetonate complex may also be formed below aluminum as a cathode buffer layer. $BaF_2$, $CaF_2$, $SrF_2$, $MgF_2$, $CsF$, $Ca_3N_2$, $Mg_3$, $N_2$, and $MgB_2$ may also be used as the cathode buffer layer. Elements made from a lamination of the anode, the organic layer, and the cathode are referred to as light emitting elements in this specification.

Figure 4A:
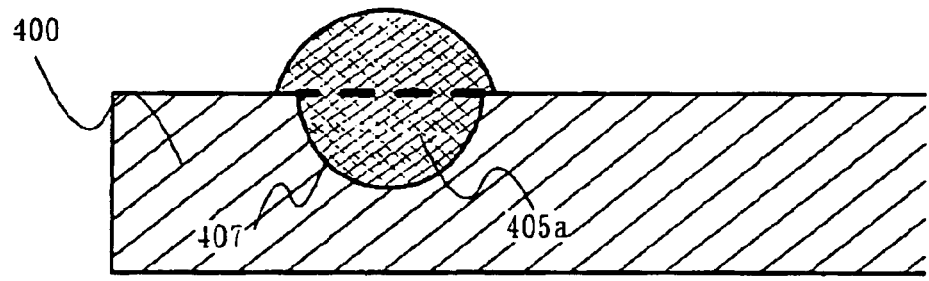
FIGS. 4A and 4B are diagrams showing a process of manufacturing a light emitting device of the present invention.
Figure 4B:
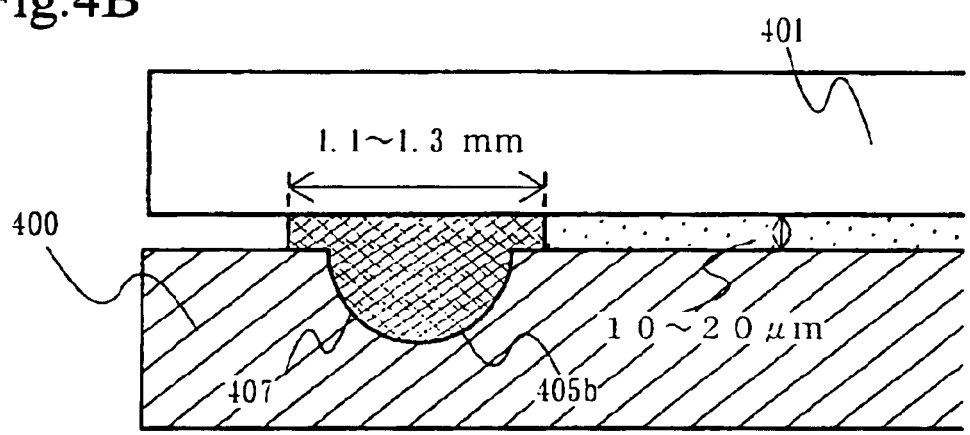

Sealing of the light emitting element 408 is performed next as shown in FIGS. 4A and 4B. A seal pattern 405a is formed in the periphery of a region in which the light emitting element 408 is formed, namely in the concave portion 407 formed in the second substrate 400. A portion of the seal pattern 405a is filled into the concave portion 407. That the sealing material fills the concave portion refers to the sealing material densely packed into a region surrounded by a dotted line segment and the concave portion in this specification. The amount of the sealing material applied may be regulated in order that the width of the seal pattern is set within a range of 1.1 to 1.3 mm, and that a gap between the first substrate 401 and the second substrate 400 is set within a range of 10 to 20 $\mu$m, after hardening of the sealing material (seal pattern formation in FIG. 4A). Note that it is preferable that the sealing material be thinner, and the gap between the substrates be as thin as possible. The gap between the first substrate 401 and the second substrate 400 is determined by the film thickness of the light emitting element 408, and is controlled by the size of a filler contained within the sealing material.

The second substrate 400 and the first substrate 401 on which the light emitting element 408 is formed are bonded (bonding in FIG. 4B). An inert gas 406 is filled within a region surrounded by the first substrate 401, the second substrate 400, the seal pattern 405b, the light emitting element 408, and the driver circuit 412, as shown in FIGS. 6A and 6B. The sealing material is then hardened by UV irradiation.

The light emitting element according to the present invention in which the concave portion is filled by the sealing material can be obtained through the above process steps. It becomes possible to suppress reductions in the bond strength between the first substrate 401 and the second substrate 400 in the light emitting device according to the present invention since the area thorough which the seal pattern 405 and the concave portion 407 contact becomes large by forming the concave portion 407 of the second substrate 400 even if the width of the seal pattern 405 is made narrower.

Although a light emitting device for lower surface emission is shown in Embodiment 1, it is also possible to manufacture a light emitting device suitable for upper surface emission provided that a transparent material is used in the second substrate 400. The case in which light passes through the second substrate 400 and emit is referred to as upper surface emission in this specification.

Although the portion of the seal pattern is formed in the single concave portion that is formed in the second substrate in Embodiment 1, a plurality of concave portions may also be formed in the second substrate and may be filled with a portion of the seal pattern. The width of the concave portions may be within a range of 0.4 to 0.5 mm, and the depth of the concave portions may be within a range of 0.08 to 0.12 mm. It becomes possible to increase the bond strength between the first substrate and the second substrate in using the light emitting device of the present invention since the area for contact between the seal pattern and the concave portions becomes large by forming the plurality of concave portions in the second substrate, even if the width of the seal pattern is made narrower.

Although wet etching is used as a method for forming the concave portion in Embodiment 1, dry etching may also be used. The cross sectional shape becomes a rectangular shape in that case, and it is preferable that the concave portions have a depth of 0.3 to 0.4 mm, approximately half of the substrate thickness.

[Embodiment 2]

Although a method of manufacturing a concave portion by etching of glass is discussed in Embodiment 1, a method of manufacturing a concave portion by sandblasting of glass is discussed in Embodiment 2. A method of manufacturing other parts of the device are the same as those of Embodiment 1, and a detailed explanation is thus omitted.

Resist is formed on portions of a glass substrate except a portion in which a concave portion is to be formed. The substrate is placed within a sandblast apparatus, and sand is blown onto the glass substrate. When the resist is then removed, a second substrate, in which a concave portion is formed by cutting glass out, is completed. A known sandblast apparatus may be used.

A light emitting element is formed next on a first substrate, on which a wiring portion and a driver circuit have been formed, and the first substrate and the second substrate on which the concave portion is formed, are bonded by using a sealing material. A light emitting device of the present invention is then completed by cutting the substrates into a desired size.

[Embodiment 3]

Although a method of forming a concave portion by sandblasting of glass is discussed in Embodiment 2, a method of manufacturing glass by using a mold is discussed in Embodiment 3. A method of manufacturing other parts of the device are the same as those of Embodiment 1, and a detailed explanation is thus omitted.

A glass substrate with a concave portion is formed by a mold. A convex shape mold is formed so as to be able to form the concave portion in the glass substrate, and a second substrate, in which a concave portion is formed, is manufactured using the mold.

A light emitting element is formed next on a first substrate, on which a wiring portion and a driver circuit have been formed, and the first substrate and the second substrate on which the concave portion is formed, are bonded by using a sealing material. A light emitting device of the present invention is then completed by cutting the substrates into a desired size.

[Embodiment 4]

Although examples of applying glass as the second substrate are discussed in Embodiments 1 to 3, an example of applying a metal as the second substrate is discussed in Embodiment 4. A method of manufacturing a second substrate in which a concave portion is formed by press molding is explained in Embodiment 4.

Manufacturing of the second substrate in which the concave portion is formed by pressing is performed first.

Next, a light emitting element is formed on a first substrate, on which a wiring portion and a driver circuit are already formed, and the first substrate and the second substrate with the concave portion are bonded by a sealing material. A light emitting device of the present invention is then completed by cutting the substrates into a desired size.

Although pressing is performed in Embodiment 4 in the method of manufacturing the second substrate in which the concave portion is formed, a metallic substrate with a concave portion formed by using a mold may also be employed.

[Embodiment 5]

The present invention can also be applied to an active light emitting device.

Figure 7:
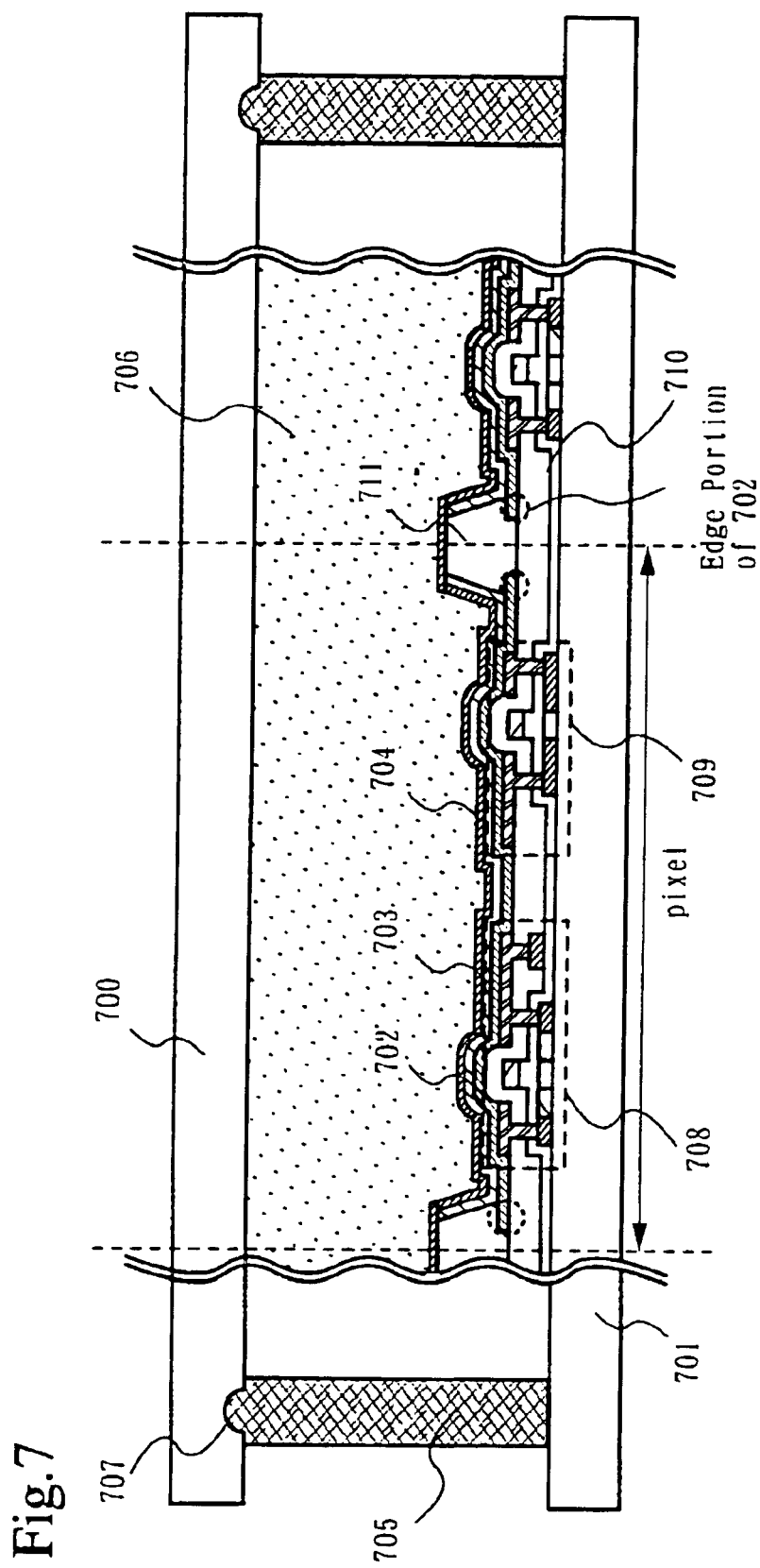
FIG. 7 is a cross sectional diagram of an active type light emitting device of the present invention.

FIG. 7 shows an example of applying the present invention to an active matrix light emitting device. Reference numeral 700 denotes a second substrate, reference numeral 701 denotes a first substrate, reference numeral 702 denotes an anode, 703 denotes an organic layer, 704 denotes a cathode, and reference numeral 705 denotes a seal pattern. In addition, reference numeral 706 denotes an inert gas, 707 denotes a concave portion, 708 denotes a switching TFT (thin film transistor) (within a dotted line portion), 709 denotes an electric current control TFT (within a dotted line portion), and reference numerals 710 and 711 denote insulating films. The extent of a pixel is shown by an arrow in FIG. 7. It is preferable to make an edge portion of the anode 702 overlap with an insulating film 711 (inside circular dotted line) in order to prevent shorts between the anode 702 and the cathode 704. The light emitting device of the present invention has the concave portion 707 filled by a sealing material.

[Embodiment 6]

The present invention can also be applied to a passive light emitting device.

Figure 8:
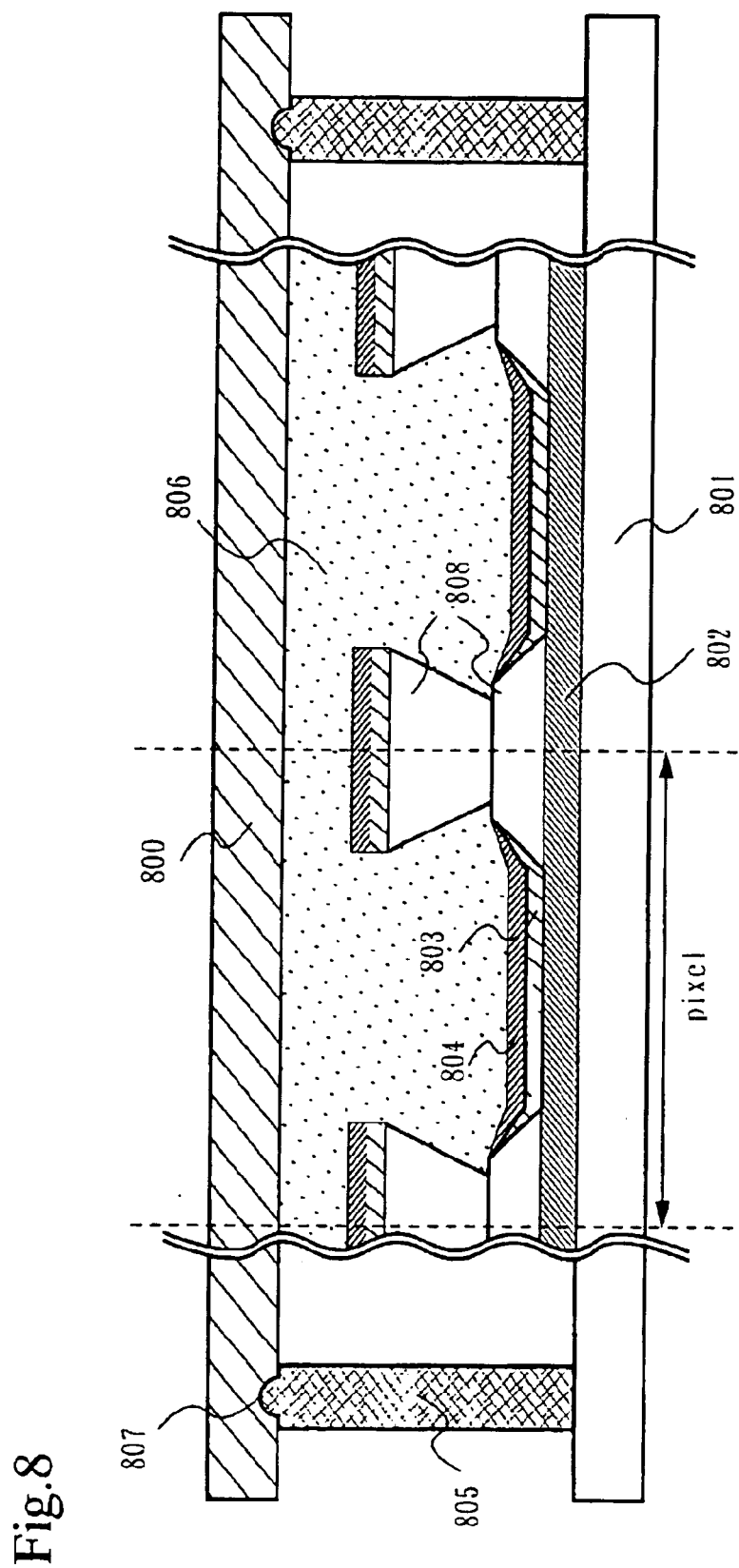
FIG. 8 is a cross sectional diagram of a passive type light emitting device of the present invention.

FIG. 8 shows an example of applying the present invention to a passive light emitting device. Reference numeral 800 denotes a second substrate, reference numeral 801 denotes a first substrate, reference numeral 802 denotes an anode, 803 denotes an organic layer, 804 denotes a cathode, and 805 denotes a seal pattern. In addition, reference numeral 806 denotes an inert gas, reference numeral 807 denotes a concave portion, and reference numeral 808 denotes an insulating film. The extent of a pixel is shown by an arrow in FIG. 8. The light emitting device of the present invention has the concave portion 807 filled by a sealing material.

[Embodiment 7]

Although examples of light emitting devices in which a sealing material fills a concave portion are shown in Embodiments 1 to 6, an example of a light emitting device in which a portion of a seal pattern is formed in a portion of a concave portion is shown in Embodiment 7. Although it is not possible to prevent the width of the seal pattern from spreading out in Embodiments 1 to 6, the increase in the width of the seal pattern toward edge surfaces can be prevented in light emitting devices manufactured in accordance with Embodiment 7.

Figure 9A:
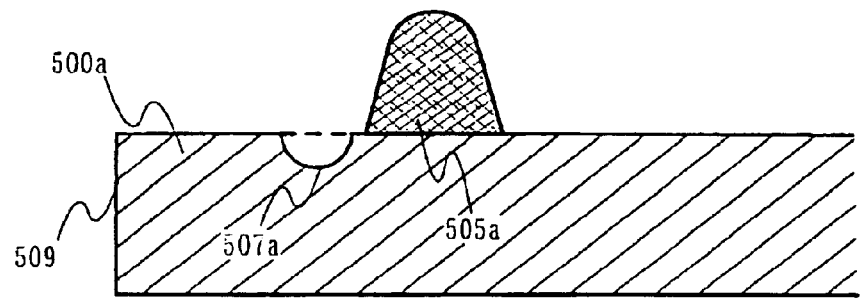
FIGS. 9A and 9B are diagrams showing a process of manufacturing a light emitting device of the present invention.
Figure 9B:
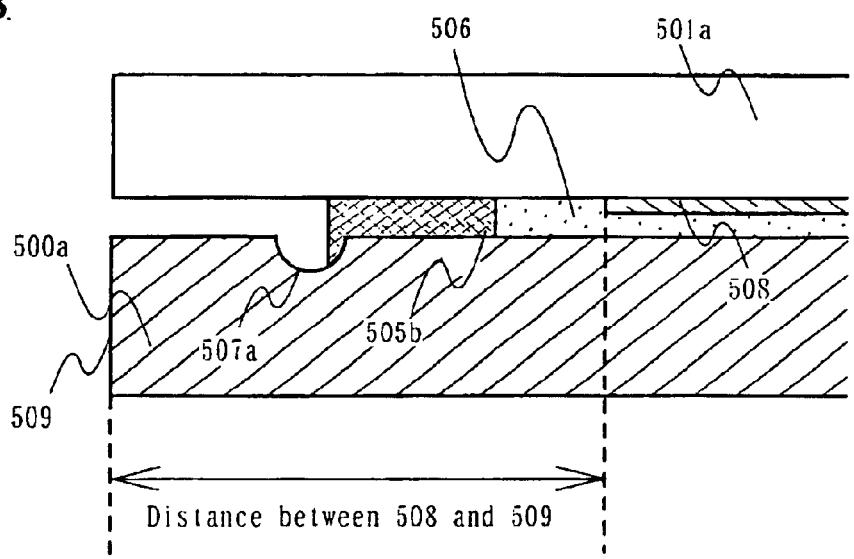

As shown in FIGS. 9A and 9B, a concave portion 507a is formed along an edge surface 509 of a second substrate 500a so as to position outside of a light emitting element 508 after bonding. A sealing material is applied to the front surface of the second substrate 500a on the opposite side of the edge surface 509 as seen from a dotted line portion on the concave portion 507a. A seal pattern 505a is thus formed (seal pattern formation in FIG. 9A). Although the seal pattern 505*a* is formed on the light emitting element 508 side as seen from the dotted line portion on the concave portion 507*a* in Embodiment 7, the seal pattern 505*a* may also be formed on the edge surface 509 side.

A first substrate 501*a*, on which a wiring portion (not shown in the figures) and a driver circuit (not shown in the figures) are formed, is then prepared. The seal pattern 505*a* is pressed down when the second substrate 500*a* and the first substrate 501*a* are bonded within an inert gas (nitrogen or a noble gas) atmosphere, and a seal pattern 505*b* is formed with a portion of the seal pattern 505*a* formed in the concave portion 507*a* (bonding in FIG. 9B). An inert gas 506 fills a region surrounded by the first substrate 511*a*, the second substrate 500*a*, the seal pattern 505*b*, the light emitting element 508, and the driver circuit (not shown in the figures). If the sealing material is a thermal setting resin, then it is hardened by using thermal pressing.

Hardening of the sealing material is progresses by using ultraviolet in a process of bonding the first substrate 501*a* and the second substrate 500*a*. Further, seepage of the sealing material toward the light emitting element 508 can be prevented in the case in which the seal pattern is formed on the edge surface 509 side (not shown in the figures).

Next, the light emitting device of the present invention, in which a portion of the seal pattern is formed in a portion of the concave portion, is completed by cutting into a desired size. It becomes possible to suppress reductions in the bond strength between the first substrate 501*a* and the second substrate 500*a* in the case of using the light emitting device of the present invention since the area for contact between the seal pattern 505*b* and the concave portion 507*a* becomes large, by forming the concave portion 507*a* in the second substrate 500*a*.

Furthermore, it is possible to accumulate spreading out of the seal pattern in the concave portion, and therefore spreading out of the seal pattern can be prevented, and the distance between the light emitting element 508 and the edge surface 509 can be made shorter if the light emitting device of the present invention is used. It thus becomes possible to make the light emitting device into a light emitting device with a narrower frame.

Although hardening of the sealing material is progressed using ultraviolet in the bonding process in Embodiment 7, the sealing material may also be hardened using heat. In the thermal pressing, the temperature of a panel is generally heated to cause the hardening reaction to take place, and the panel temperature is lowered back to room temperature when hardening is complete. It is preferable to arrange the second substrate 500*a*, on which the concave portion 507*a* is formed, at the bottom, and to arrange the first substrate 501*a* at the top during the thermal pressing. Any of the sealing material that has seeped out can accumulate in the concave portion 507*a*, and the sealing material can be prevented from reaching the side surface 509, by using this type of arrangement, even if the width of the seal pattern increases.

[Embodiment 8]

Another example of a method of manufacturing a light emitting device which has the second substrate 500*a* with the concave portion 507*a* used in Embodiment 7, is shown in Embodiment 8.

Figure 11A:
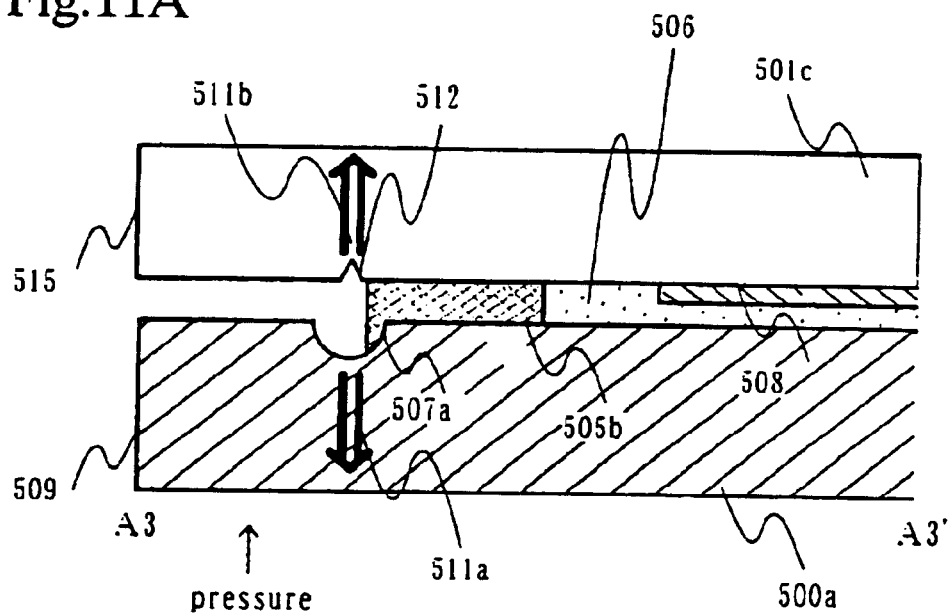
FIGS. 11A and 11B are diagrams showing a process of manufacturing a light emitting device of the present invention.
Figure 11B:
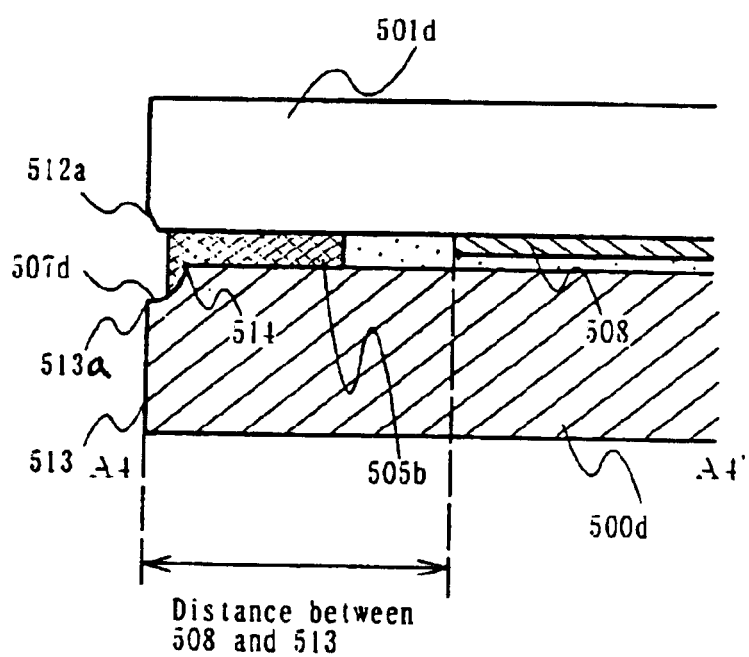

A light emitting device with a portion of the seal pattern 505*b* on an edge surface 514, as shown in FIGS. 11B is manufactured in Embodiment 8 after bonding and cutting, in order to make the light emitting device manufactured in Embodiment 7 into a light emitting device with a narrower frame.

Figure 10A:
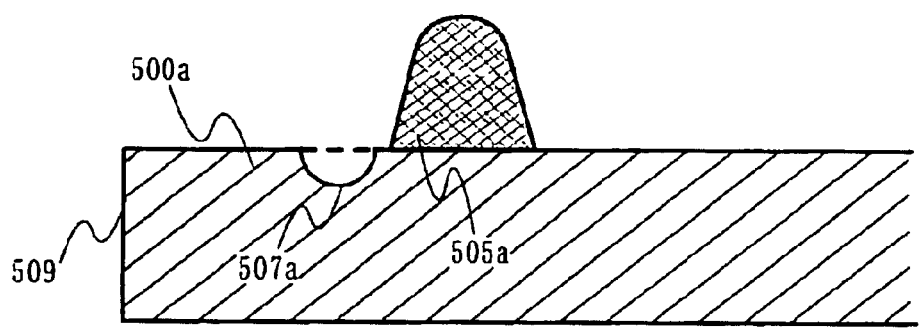
FIGS. 10A and 10B are diagrams showing a process of manufacturing a light emitting device of the present invention.
Figure 10B:
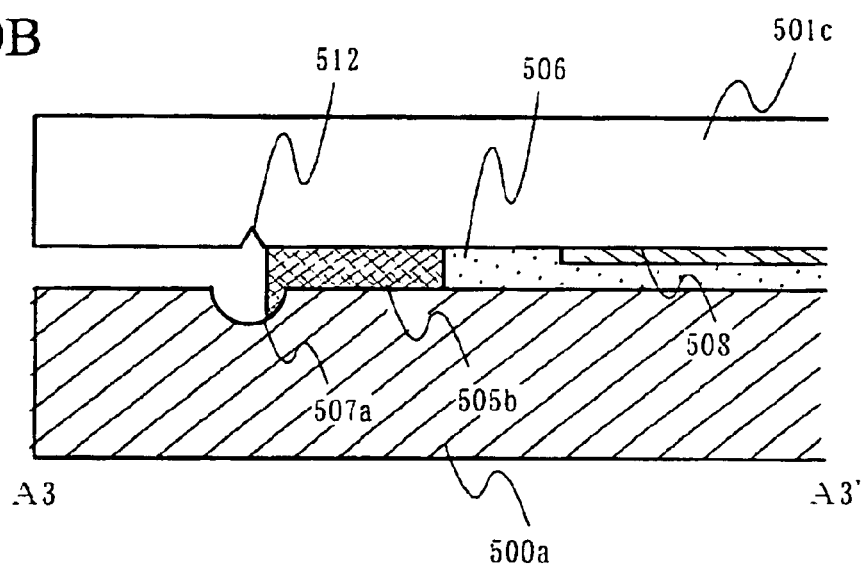

The second substrate 500*a* which has the seal pattern 505*a*, the concave portion 507*a*, and the edge surface 509 is prepared (seal pattern formation in FIG. 10A). In order to perform bonding as shown in FIG. 10B, the light emitting element 508 and a scribe line 512 are formed on the front surface of a first substrate 501*c*, so that the scribe line 512 overlaps with the concave portion 507*a* as seen from a normal direction to the second substrate 500*a* and the first substrate 501*c* in FIG. 12. An upper surface diagram of the second substrate 500*a* and the first substrate 501*c* bonded together is shown in FIG. 12. A cross sectional diagram cut along a dotted line segment A3–A3' of FIG. 12 corresponds to FIG. 10B. A wiring portion 502 and a driver circuit 504 are formed on the first substrate 501*c*. The wiring portion is a gathering of wirings electrically connected to the driver circuit.

The second substrate 500*a* and the first substrate 501*c* are bonded within an inert gas (nitrogen or a noble gas) atmosphere (see FIG. 10B). The inert gas 506 fills a region surrounded by the first substrate 501*c*, the second substrate 500*a*, the seal pattern 505*b*, the light emitting element 508, and a driver circuit (not shown in the figures).

A crack 511*a* then develops in the second substrate 500*a* in the direction of the arrow, provided that pressure is applied to the rear surface of the second substrate 500*a* in the direction of the arrow by using a break bar of a break machine, as shown in FIG. 11A. When the crack 511*a* reaches the rear surface of the second substrate 500*a*, then a portion of the second substrate, from the crack 511*a* to the edge surface 509, is cut off out of the second substrate 500*a*. A second substrate 500*d* with an edge surface 513 and a concave portion 507*d* is thus formed. The concave portion 507*d* is formed along the edge portion 514 and the edge portion 513*a* of the second substrate 500*d*. A cutaway portion of the second substrate 500*a* impacts on the first substrate 501*c*, and a crack 511*b* develops from the scribe line 512. A portion of the first substrate 501*c* from the crack 511*b* to an edge surface 515 is cut off. A light emitting device, which has a first substrate 501*d* in which a portion 512*a* of the scribe line is formed and the second substrate 500*d* in which the concave portion 507*d* is formed, is thus obtained (after cutting in FIG. 11B). In this specification, the term "crack" refers to forming a fissure and cracking. If the portion of the first substrate 50*c* from the scribe line 512 to the edge surface 515 does not break off, then pressure may be applied to the rear surface of the first substrate 501*c* inside of the edge face 515 by using a break bar of a break machine. The portion of the first substrate 501*c* from the crack 511*b* to the edge face, is cut off, and the light emitting device with the portion 512*a* of the scribe line is obtained.

Figure 13:
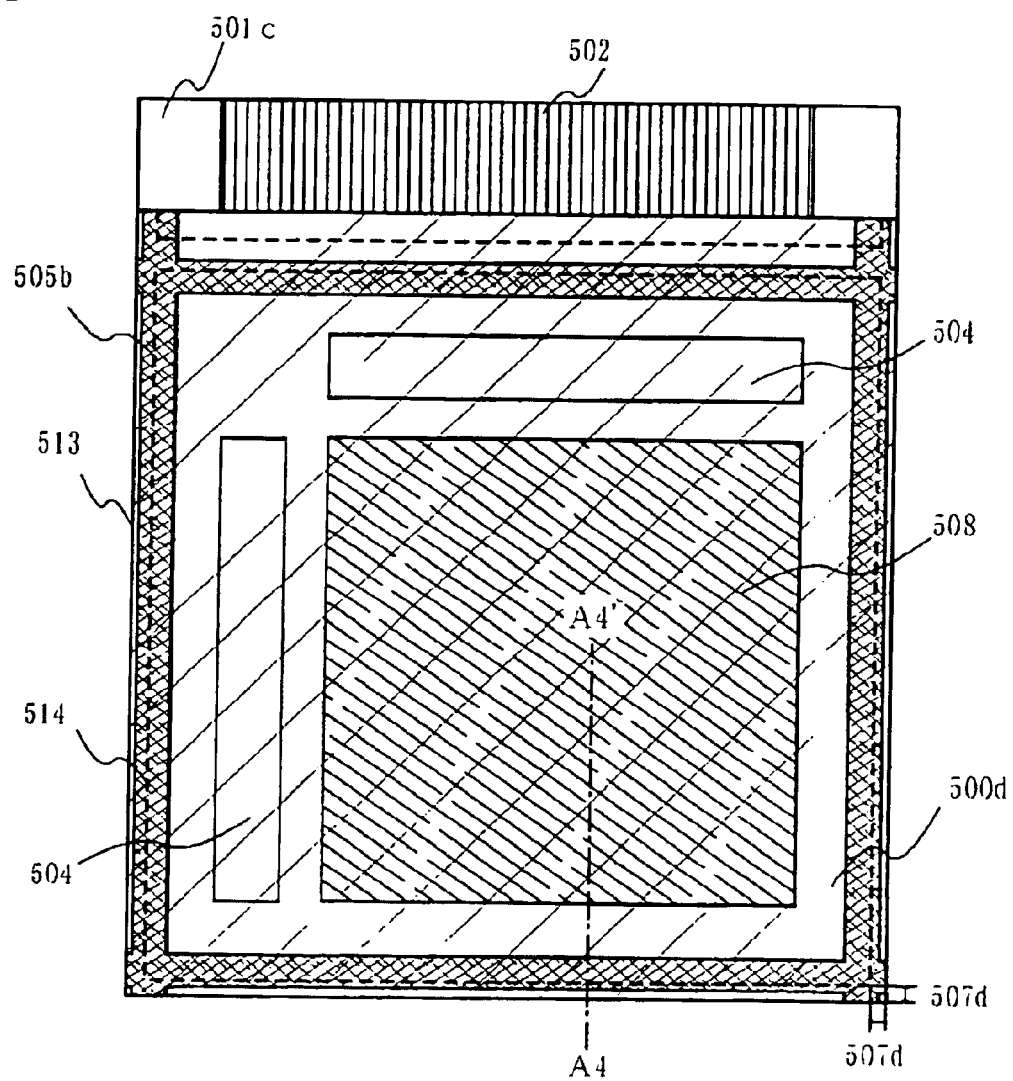
FIG. 13 is an upper surface diagram of a light emitting device of the present invention.

Further, it is preferable that the scribe line 512 be formed in the rear surface or the front surface of the second substrate 500*a*, and be formed so as to overlap with the concave portion 507*a* as seen form a normal direction to the substrate. It is preferable to cut a portion of the second substrate, from an edge surface to the concave portion, from the second substrate, at each of the three edges except for the wiring portion side. It is also preferable to cut a portion of the first substrate, from an edge surface to the scribe line, from the first substrate, at each of the three edges except for the wiring portion side. An upper surface diagram of the light emitting device after cutting (see FIG. 11B) is shown in FIG. 13. A cross sectional diagram cut along a dotted line segment A4–A4' in FIG. 13 corresponds to FIG. 11B.

The light emitting device of the present invention in which a portion of the seal pattern is formed on a portion of the concave portion is thus completed through the above process steps. It becomes possible to suppress reductions in the bond strength between the first substrate 501d and the second substrate 500d in the case of using the light emitting device of the present invention since the area in which the seal pattern and the concave portion contact becomes large in accordance with forming the concave portion 507d in the second substrate 500d.

Further, the distance between the edge surface and the light emitting element 508 can be made shorter as seen by an observer in accordance with cutting off a portion of the first substrate 501c from the scribe line 512 to the edge surface 515, and cutting off a portion of the second substrate 500a from the concave portion 507a to the edge surface 509. It therefore becomes possible to make a light emitting device with a narrower frame.

In addition, a portion of the seal pattern 505b is formed on the edge portion 514 on the front surface of the second substrate 500d by using the light emitting device of the present invention, and it thus becomes possible to provide a sturdy light emitting device.

It becomes unnecessary to form a scribe line in the second substrate when the manufacturing process of Embodiment 8 is used.

[Embodiment 9]

A method of manufacturing a light emitting device are shown in each of Embodiments 1 to 8 using a second substrate in which a single concave portion is formed. In Embodiment 9, a method of manufacturing a light emitting device using a second substrate in which a plurality of concave portions are formed. In the light emitting device manufactured in accordance with Embodiment 7, the width of the seal pattern can be prevented from expanding toward the edge surface with respect to the light emitting element. In Embodiment 8, the seal pattern can be prevented from expanding not only toward the edge surface with respect to the light emitting element, but also toward the light emitting element side with respect to the edge surface.

Figure 14A:
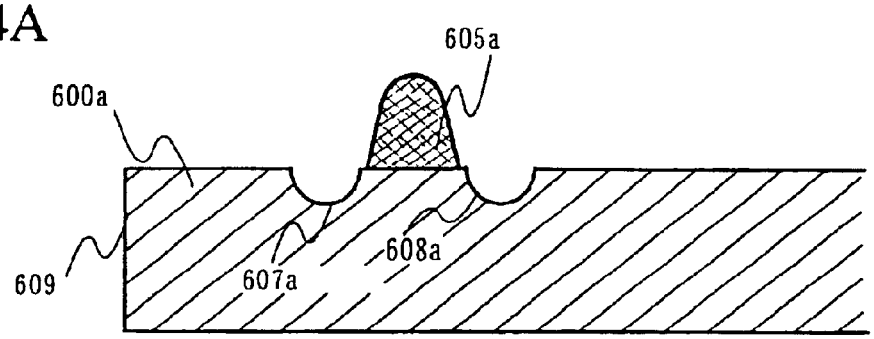
FIGS. 14A and 14B are diagrams showing a process of manufacturing a light emitting device of the present invention.
Figure 14B:
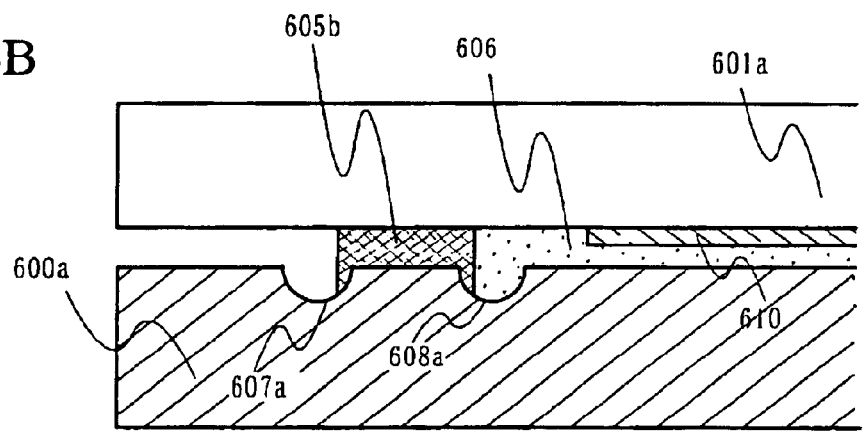

Concave portions 607a and 608a are formed in a second substrate 600a along an edge surface 609 and so as to position outside of a light emitting element 610 after bonding with a first substrate 601c as shown in FIG. 14B. A sealing material is applied to the front surface of the second substrate 600a between the concave portion 607a and the concave portion 608a, and a seal pattern 605a is formed (seal pattern formation in FIG. 14A). The seal pattern 605a is pressed down in bonding the second substrate 600a and the first substrate 601a within an inert gas (nitrogen or a noble gas) atmosphere (bonding in FIG. 14B), and a portion of the seal pattern 605a is formed in the concave portion 607a and in the concave portion 608a.

Hardening of the sealing material is progressed by using ultraviolet in a process of bonding the first substrate 601a and the second substrate 600a.

A light emitting device in which a portion of the seal pattern is formed in portions of the concave portions is thus completed through the above processes. The light emitting device of the present invention makes a narrow frame possible. An inert gas 606 fills a region surrounded by the second substrate 600a (containing a portion of the concave portion 608a), the first substrate 601a, the seal pattern 605b, the light emitting element 608, and a driver circuit (not shown in the figures). A discussion of the upper surface diagram of FIG. 14B is omitted.

It becomes possible to suppress reductions in the bond strength between the first substrate 601a and the second substrate 600a in the case of using the light emitting device of the present invention since the area in which the seal pattern 605a contacts the concave portion 607a and the concave portion 608a is larger in accordance with forming the concave portion 607a and the concave portion 608a in the second substrate 600a. Furthermore, the sealing material that seeps out during bonding can accumulate in the convex portions in the case of using the light emitting device of the present invention, and therefore the width of the seal pattern can be prevented from expanding, and the distance between the light emitting element 610 and the edge surface 609 can be made shorter.

Although hardening of the sealing material is progressed using ultraviolet in the bonding process in Embodiment 9, the sealing material may also be hardened using heat. In general, the temperature of a panel is heated to 100° C. in thermal pressing to cause the hardening reaction to take place, and the panel temperature is lowered back to a room temperature when hardening is complete. It is preferable to arrange the second substrate 600a with the concave portion 607a and the concave portion 608a at the bottom, and to arrange the first substrate 601a at the top during the thermal pressing. Any of the sealing material that has seeped out can accumulate in the concave portion 607a or the concave portion 608a, and the sealing material can be prevented from reaching the side surface 609 and from reaching the light emitting element 610.

[Embodiment 10]

Another example of a method of manufacturing a light emitting device, using the second substrate 600a with the concave portion 607a and the concave portion 608a used in Embodiment 9, is shown in Embodiment 10.

Figure 15A:
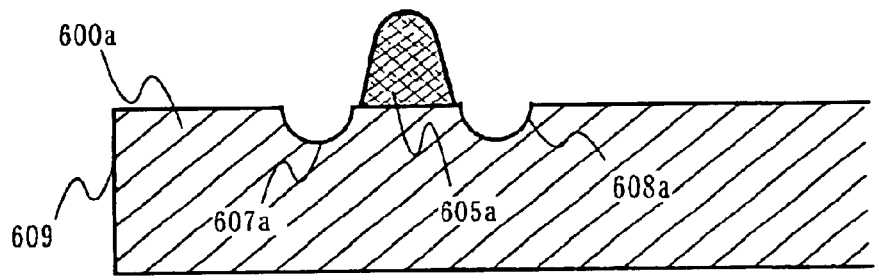
FIGS. 15A and 15B are diagrams showing a process of manufacturing a light emitting device of the present invention.
Figure 15B:
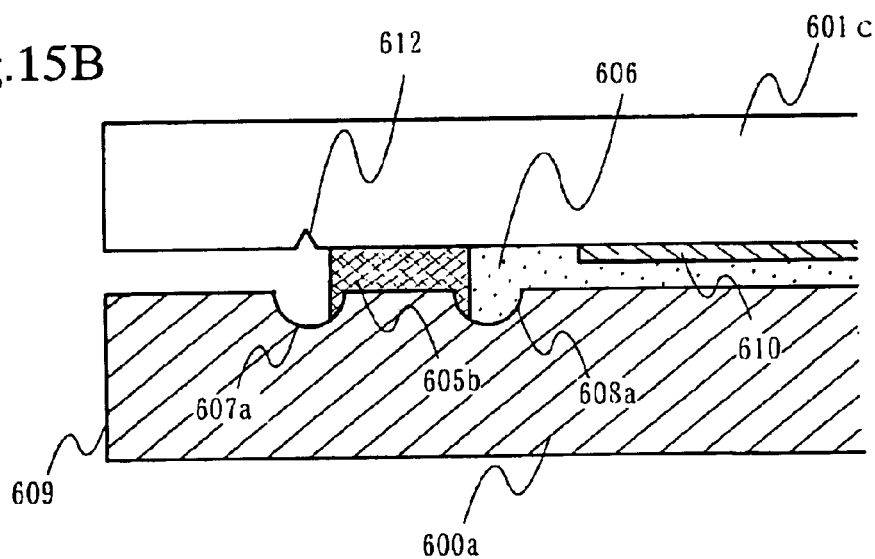

In order to make the light emitting device manufactured in Embodiment 9 into a light emitting device with a narrower frame, first, the second substrate 600a which has the seal pattern 605a, the concave portion 607a, the concave portion 608a, and the edge surface 609 is prepared (seal pattern formation in FIG. 15A). The light emitting element 610 is formed on a first substrate 601c that has a scribe line 612 formed on its front surface, so that the scribe line 612 overlaps with the concave portion 607a as seen from a normal direction to the first substrate 601c in order to perform bonding (as shown in FIG. 15B).

Figure 16A:
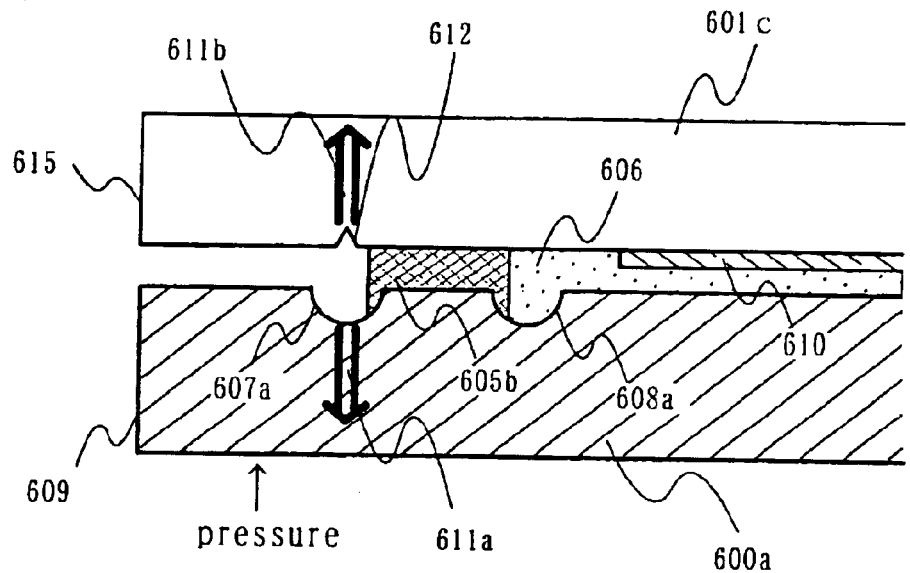
FIGS. 16A and 16B are diagrams showing a process of manufacturing a light emitting device of the present invention.
Figure 16B:
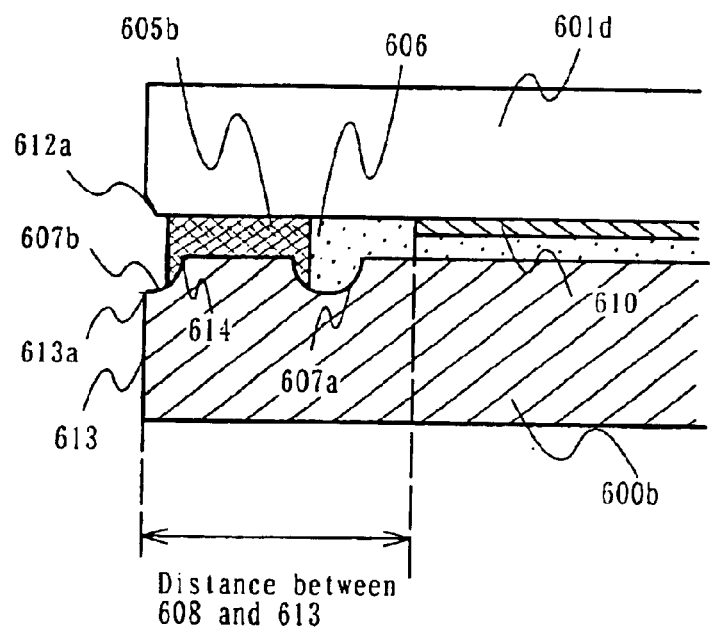

The second substrate 600a and the first substrate 601c are bonded within an inert gas (nitrogen or a noble gas) atmosphere as shown in FIG. 16A (cutting). An inert gas 606 fills a region surrounded by the first substrate 601c, the second substrate 600a (including a portion of the concave portion 608a), the seal pattern 605b, the light emitting element 610, and a driver circuit (not shown in the figures). A crack 611a then develops in the second substrate 600a in the direction of the arrow, provided that pressure is applied to the rear surface of the second substrate 600a between the edge surface 609 and the concave portion 607a in the direction of the arrow by using a break bar of a break machine. When the crack 611a reaches the rear surface of the second substrate 600a, then a portion of the second substrate 600a from the crack 611a to the edge surface 609 is cut off. A second substrate 600b with a concave portion 607b and a edge surface 613 is thus formed. The concave portion 607b is formed along the edge portion 613a and the edge portion 614. A cutaway portion of the second substrate 600a impacts on the first substrate 601c, and a crack 611b develops from the scribe line 612. A portion of the first substrate 601c from the crack 611b to an edge surface 615 is cut off. A light emitting device which has a first substrate 601d in which a portion 612a of the scribe line is formed, and the second substrate 600b in which the concave portion 607b is formed, is thus obtained. If the portion of the first substrate 601c from the scribe line 612 to the edge face 615 does not break off, then pressure may be applied to the rear surface of the second substrate 600a between the edge surface 615 and the scribe line 612 by using a break bar of a break machine. The portion of the first substrate 601c from the crack 611b to the edge surface 615 is cut off, and the first substrate 601d is formed. The light emitting device which has a portion of the seal pattern formed in a portion of the concave portion is thus obtained (after cutting in FIG. 16B). A discussion of the upper surface diagram of the light emitting device in FIG. 16B (after cutting) is omitted.

It becomes possible to suppress reductions in the bond strength between the first substrate 601d and the second substrate 600b in the case of using the present invention since the area through which the seal pattern 605b contacts the concave portion 607b and the concave portion 608a is larger in accordance with forming the concave portion 607b and the concave portion 608b in the second substrate 600b.

Further, the distance between the edge surface and the light emitting element 610 can be made shorter in accordance with cutting off the portion of the first substrate 601c from the scribe line 612 to the edge surface 615, and cutting off the portion of the second substrate 600a from the concave portion 607a to the edge surface 609. It therefore becomes possible to make a light emitting device have a narrower frame.

In addition, a portion of the seal pattern 605b is formed on the edge portion 614 of the second substrate 600b by using the light emitting device of the present invention, and it thus becomes possible to provide a sturdy light emitting device.

A process for forming a scribe line in the second substrate becomes unnecessary in the case of using the manufacturing processes of Embodiment 10.

[Embodiment 11]

A light emitting device of the present invention has superior visibility in a bright location in comparison with a liquid crystal display, because it is a self-emitting type, and also has a wide angle of view. Therefore, it can be used as a display portion of various electronic equipment. The light emitting device of the present invention may be used, for example, in the display portion of a 30 inch or larger (typically 40 inch or larger) diagonal display for appreciation of a TV broadcast or the like by a large screen.

Note that the display includes all display devices for displaying information, such as a personal computer display device, a display device for receiving TV broadcasts, and a display device for displaying advertisements. Further, the light emitting device of the present invention can also be used in the display portion of other various electronic equipment.

The following can be given as such electronic equipment of the present invention: a video camera; a digital camera; a goggle type display device (a head mounted display); a navigation system; an audio playback device (such as a car audio system or an audio component system); a notebook type personal computer; a game machines (an electronic amusement device); an onboard reverse direction confirmation monitor for a vehicle; a TV telephone; a portable information terminal (such as a mobile computer, a portable telephone a portable game machine, or an electronic book); and an image playback device equipped with a recording medium (specifically, a device prepared with a display which can play back a recording medium such as a DVD to display the image thereof). Specific examples of these electronic equipment are shown in FIGS. 17A to 19D. In this specification, the onboard reverse direction confirmation monitor for a vehicle is a light emitting device having a display portion that utilize a camera or the like to display a place where the driver cannot see due to the driver's blind spot.

Figure 17A:
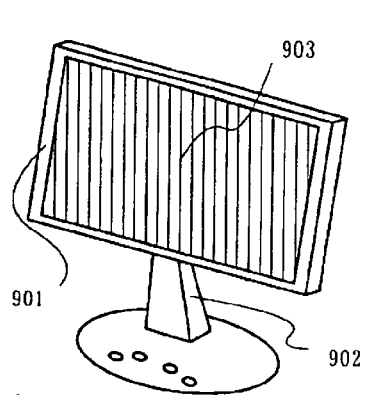
FIGS. 17A to 17F are diagrams showing electronic equipment of the present invention.

FIG. 17A is a display, and contains a frame 901, a support stand 902, and a display portion 903, etc. The light emitting device of the present invention can be used in the display portion 903. Note that, the light emitting display is a self-emitting type, and therefore, a back light is not necessary, whereby the display portion can be made thinner than that of a liquid crystal display.

Figure 17B:
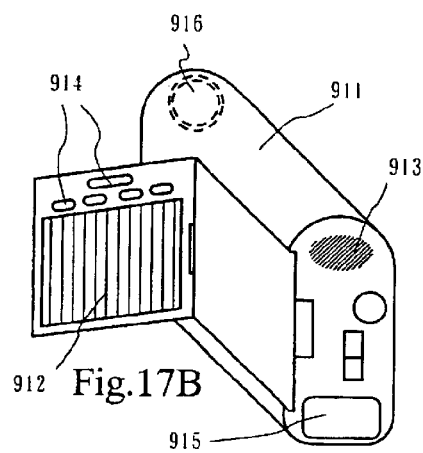

FIG. 17B is a video camera, and contains a main body 911, a display portion 912, a sound input portion 913, operation switches 914, a battery 915, and an image receiving portion 916. The light emitting device of the present invention can be used in the display portion 912.

Figure 17C:
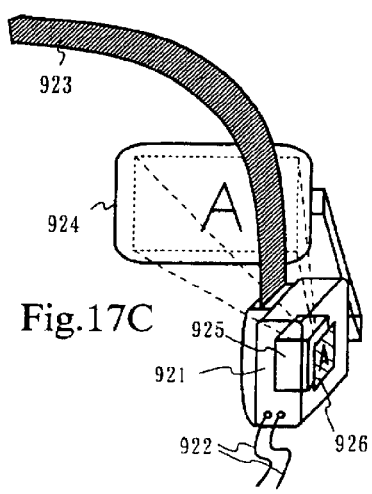

FIG. 17C is a portion (right side) of a head mounted display, and contains a main body 921, a signal cable 922, a head fixing band 923, a display portion 924, an optical system 925, and a display device 926, etc. The light emitting device of the present invention can be used in the display device 926.

Figure 17D:
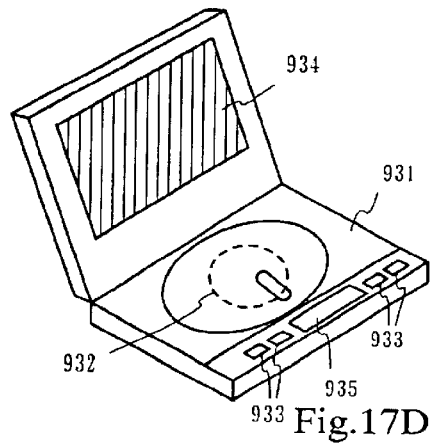

FIG. 17D is an image playback device equipped with a recording medium (specifically, a DVD player), and contains a main body 931, a recording medium (such as a DVD) 932, operation switches 933, a display portion (a) 934, and a display portion (b) 935, etc. The display portion (a) 934 is mainly used for displaying image information, and the display portion (b) 935 is mainly used for displaying character information, and the light emitting device of the present invention can be used in the display portion (a) 934 and in the display portion (b) 935. Note that the image playback device equipped with the recording medium includes equipment such as household game machines.

Figure 17E:
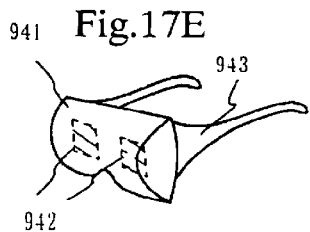

FIG. 17E is a goggle type display device (head mounted display), and contains a main body 941, a display portion 942, and an arm portion 943. The light emitting device of the present invention can be used in the display portion 942.

Figure 17F:
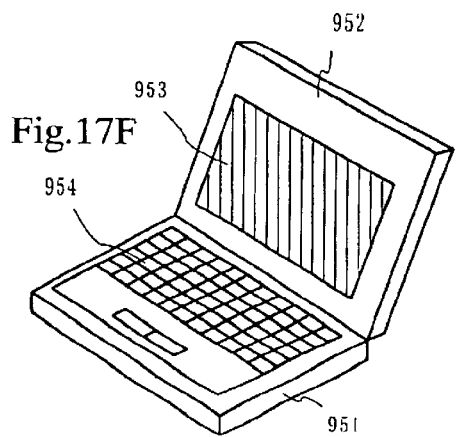

FIG. 17F is a personal computer, and contains a main body 951, a frame 952, a display portion 953, and a keyboard 954. The light emitting device of the present invention can be used in the display portion 953.

Note that, if the brightness of light emitting of organic layer materials increases in the future, then it will become possible to use the light emitting device of the present invention in a front type or a rear type projector to expand and project light containing output image information with a lens or the like.

Further, there is increased a case where information delivered via an electronic communication line, such as the Internet or CATV (cable television) is displayed in the above electric equipment, and opportunities to display dynamic image information in particular are increasing. The response speed of the organic layer materials is extremely high, and therefore it is preferable to use the light emitting device of the present invention for dynamic image display.

Figure 18A:
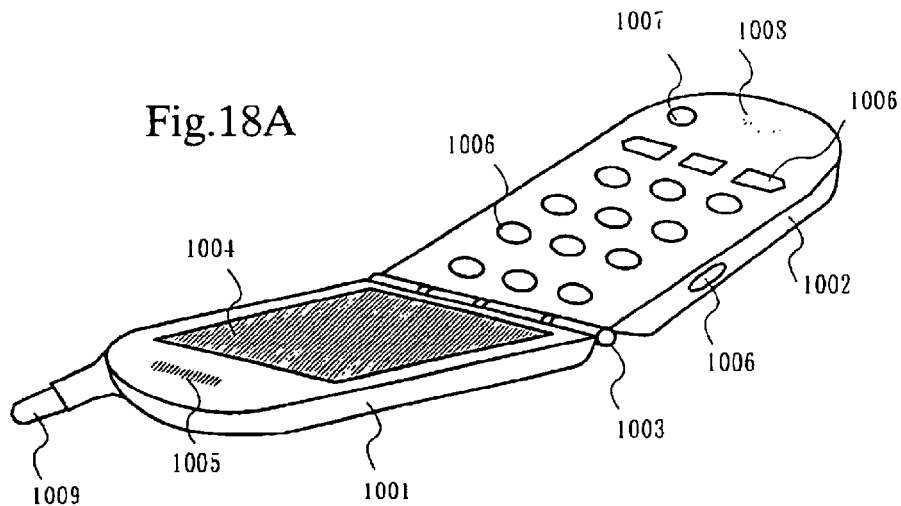
FIGS. 18A to 18C are diagrams showing electronic equipment of the present invention.

FIG. 18A is a portable telephone, and contains a display panel 1001, an operation panel 1002, a connecting portion 1003, a display portion 1004, a sound output portion 1005, operation switches 1006, a power switch 1007, a sound input portion 1008, and an antenna 1009. The light emitting device of the present invention can be used in the display portion 1004. Note that, by displaying white color characters on a black color background, the display portion 1004 can suppress the power consumption of the portable telephone.

Figure 18B:
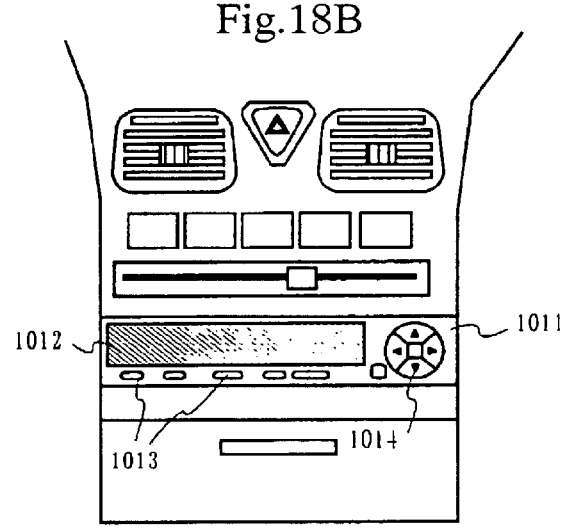

FIG. 18B is an audio playback device, specifically a car audio system, and contains a main body 1011, a display portion 1012, operation switch 1013, and operation switch 1014. The light emitting device of the present invention can be used in the display portion 1012. Further, a car audio system is shown in Embodiment 11, but a portable type or a household audio playback system may also be used. Note that, by displaying white color characters on a black color background, the display portion 1014 can suppress the power consumption. This is especially effective in a portable type audio playback device.

Figure 18C:
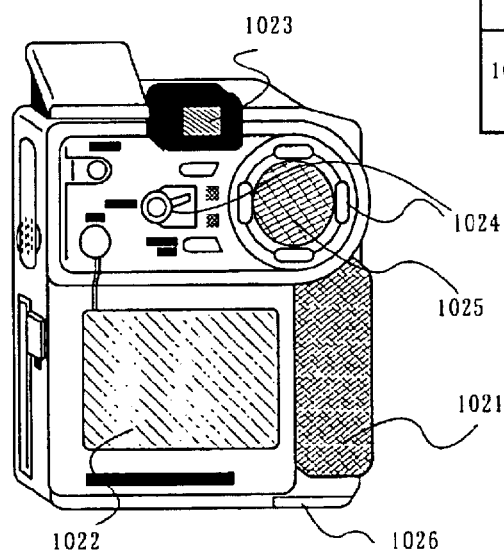

FIG. 18C is a digital camera, and contains a main body 1021, a display portion (A) 1002, an eye piece 1023, operation switches 1024, a display portion (B) 1025, and a battery 1026. The light emitting device of the present invention can be used in the display portion (A) 1022 and in the display portion (B) 1025. Further, when the display portion (B) 1025 is mainly used as an operation panel, power consumption can be suppressed by displaying white color characters on a black color background.

Figure 19A:
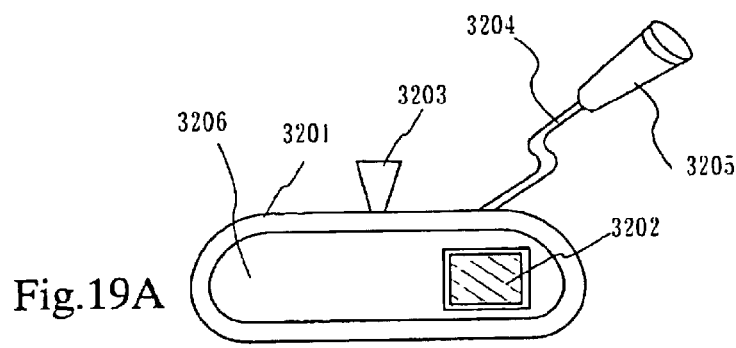
FIGS. 19A to 19D are diagrams showing electronic equipment of the present invention.

FIG. 19A is an onboard reverse direction confirmation monitor for a vehicle, and contains a main body 3201, a display portion 3202, a connecting portion with the vehicle 3203, a relay cable 3204, a camera 3205, and a mirror 3206. The light emitting device of the present invention can be used in the display portion 3202. In the present invention, the mirror 3206 with the display portion 3202 built in is shown, but the mirror and the display portion may be arranged by being separated.

Figure 19B:
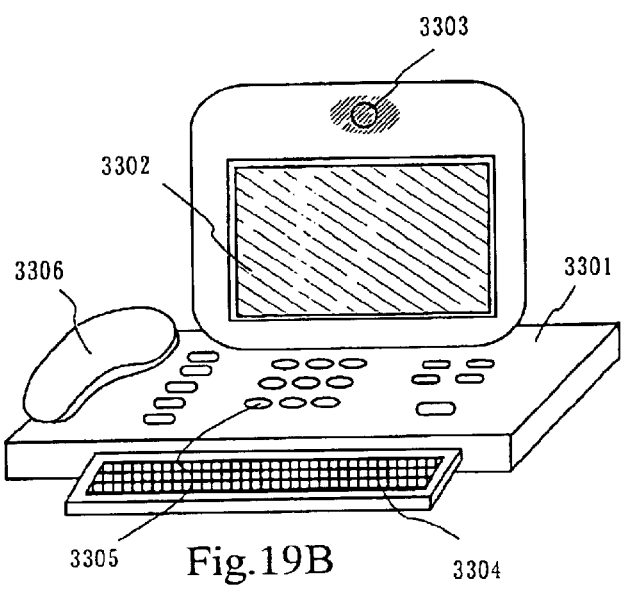

FIG. 19B is a TV telephone, and contains a main body 3301, a display portion 3302, an image receiving portion 3303, a keyboard 3304, operational switches 3305, and a telephone receiver 3306. The light emitting device of the present invention can be used in the display portion 3302.

Figures 19C, 19D:
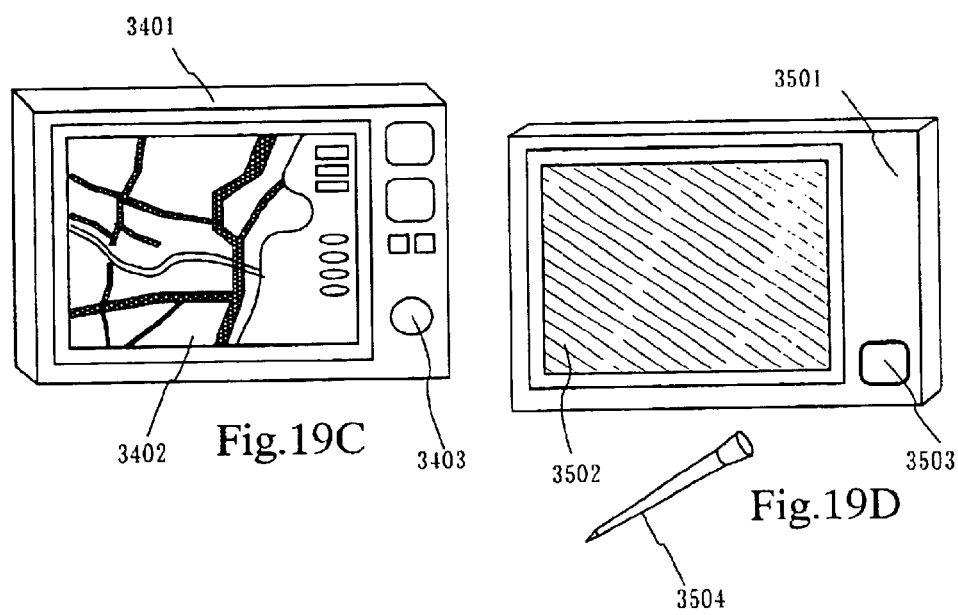
Figure 20A:
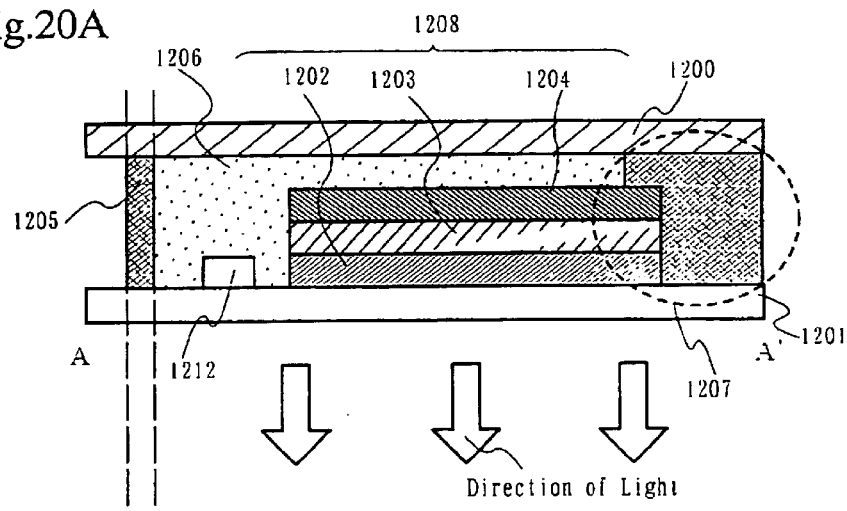
FIGS. 20A and 20B are a cross sectional diagram and an upper surface diagram, respectively, of a light emitting device in which seepage of a sealing material has developed.
Figure 20B:
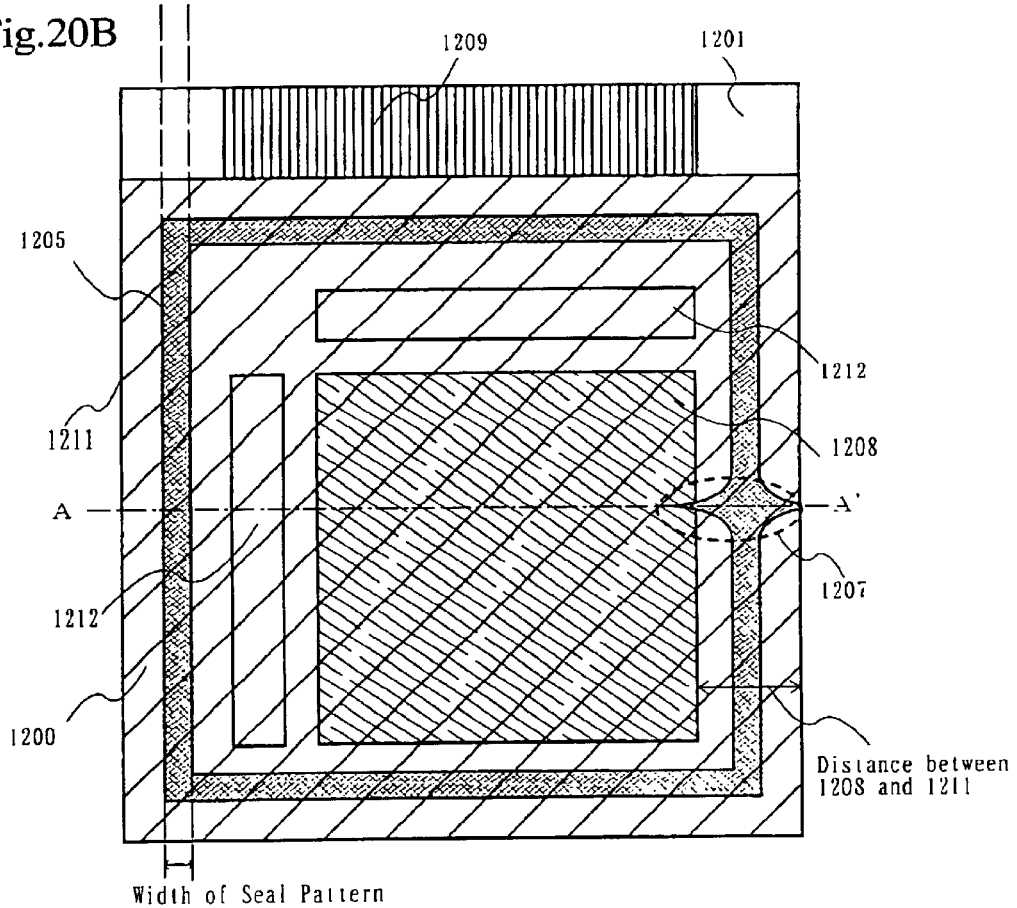
Figure 21:
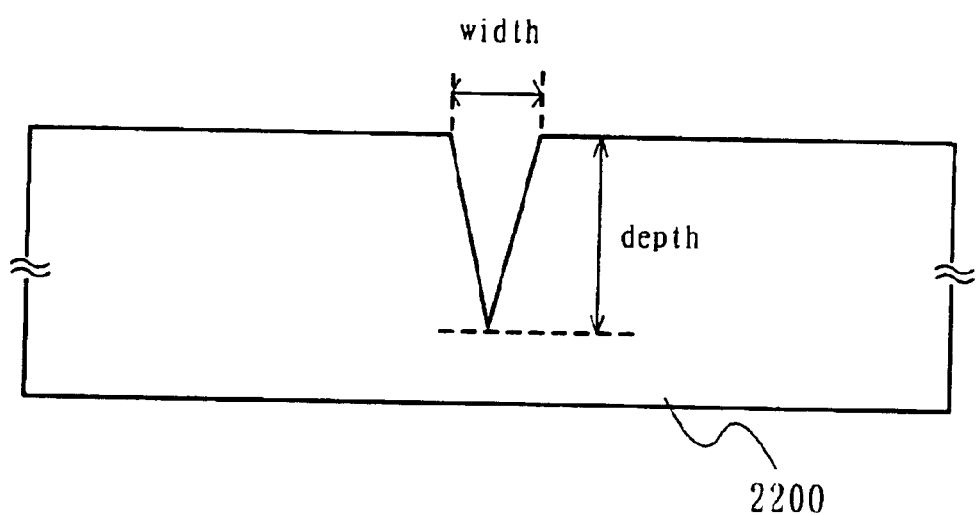
FIG. 21 is a diagram for explaining a scribe line.

FIG. 19C is a car navigation system, and contains a main body 3401, a display portion 3402, and operational switches 3403. The light emitting device of the present invention can be used in the display portion 3402. In the display portion 3402, there will be shown a picture such as a road map.

FIG. 19D is an electronic notebook, and contains a main body 3501, a display portion 3502, an operational switch 3503, and an electronic pen 3506. The light emitting device of the present invention can be used in the display portion 3502.

A method of adding functionality such as forming a sensor portion for sensing the external brightness, and reducing the brightness of the display portion when used in a dark place can be given as a method of reducing the power consumption in the portable type electronic equipment shown in Embodiment 11.

The applicable range of the present invention is thus extremely wide, and it is possible to apply the present invention to electronic equipment in all fields. Furthermore, the electronic equipment of Embodiment 11 can also be realized by applying any structure described in Embodiments 1 to 10.

The width of a seal pattern can be kept thin when a first substrate and a second substrate are bonded, according to a light emitting device of the present invention, and therefore it becomes possible to make the light emitting device have a narrow frame.

Further, a portion of the seal pattern is formed on an edge portion of the substrate in the case of using a light emitting device of the present invention, and it thus becomes possible to provide a sturdy light emitting device.

In addition, it becomes unnecessary to employ a step of forming scribe lines on the second substrate in the case of using a manufacturing process of a light emitting device according to the present invention.

Furthermore, seepage of a sealing material can be prevented by using the light emitting device of the present invention, even if an organic layer with high thermal endurance is developed in the future and the components within the sealing material are melted by thermal pressing during manufacturing the light emitting device.

The present invention can be applied not only to the manufacture of light emitting devices, but also to the manufacture of liquid crystal display devices.

What is claimed is:

1. A display device comprising:
    a first substrate;
    a second substrate in which at least one concave portion is formed; and
    a light emitting element in which an anode, an organic layer, and a cathode are laminated over the first substrate,
    wherein the second substrate and the first substrate are bonded through a sealing material, and
    wherein the sealing material fills the concave portion of the second substrate.

2. A display device according to claim 1, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

3. A display device according to claim 1, the light emitting element comprising: an anode over the first substrate, an organic layer over the anode, and a cathode over the organic layer.

4. A display device comprising:
    a first substrate; and
    a second substrate in which at least one concave portion is formed, and
    a light emitting element in which an anode, an organic layer, and a cathode are laminated over the first substrate,
    wherein the second substrate and the first substrate are bonded through a seal pattern, and
    wherein a portion of the seal pattern is formed in a portion of the concave portion.

5. A display device according to claim 4, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

6. A display device according to claim 4, the light emitting element comprising: an anode over the first substrate, an organic layer over the anode, and a cathode over the organic layer.

7. A display device comprising:
    a first substrate in which a portion of a scribe line is formed; and
    a second substrate in which a concave portion is formed,
    wherein the second substrate and the first substrate are bonded through a seal pattern, and
    wherein a portion of the seal pattern is formed in a portion of the concave portion, and
    wherein the scribe line overlaps with the concave portion.

8. A display device according to claim 7 further comprising a light emitting element in which an anode, an organic layer, and a cathode are laminated on the first substrate.

9. A display device according to claim 7, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

10. A display device comprising:

a first substrate; and a second substrate in which a plurality of concave portions are formed, and a light emitting element in which an anode, an organic layer, and a cathode are laminated over the first substrate, wherein the second substrate and the first substrate are bonded through a sealing material, and wherein the sealing material fills at least one concave portion of the plurality of concave portions.

11. A display device according to claim 10, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

12. A display device according to claim 10, light emitting element comprising: an anode over the first substrate, an organic layer over the anode, and a cathode over the organic layer.

13. A display device comprising:

a first substrate; and a second substrate in which a plurality of concave portions are formed, and a light emitting element in which an anode, an organic layer, and a cathode are laminated over the first substrate, wherein the second substrate and the first substrate are bonded through a seal pattern, and wherein a portion of the seal pattern is formed in at least one concave portion of the plurality of concave portions.

14. A display device according to claim 13, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

15. A display device according to claim 13, the light emitting element comprising: an anode over the first substrate, an organic layer over the anode, and a cathode over the organic layer.

16. A display device comprising:

a first substrate in which a portion of a scribe line is formed; and a second substrate in which a plurality of concave portions are formed, wherein the second substrate and the first substrate are bonded through the seal pattern, and wherein a portion of the sealing pattern is formed in at least one concave portion of the plurality of concave portions and wherein the scribe line overlaps with the concave portion.

17. A display device according to claim 16 further comprising a light emitting element in which an anode, an organic layer, and a cathode are laminated on the first substrate.

18. A display device according to claim 16, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

19. A display device comprising:

a first substrate;

a second substrate in which at least one concave portion is formed; and a thin film transistor over the first substrate, wherein the second substrate and the first substrate are bonded through a sealing material, and wherein the sealing material fills the concave portion of the second substrate.

20. A display device according to claim 19 further comprising a light emitting element in which an anode, an organic layer, and a cathode are laminated on the first substrate.

21. A display device according to claim 19, wherein the display device is one of the a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

22. A display device comprising:

a first substrate;

a second substrate in which at least one concave portion is formed; and a thin film transistor over the first substrate, wherein the second substrate and the first substrate are bonded through a sealing material, wherein the sealing material fills the concave portion of the second substrate, and wherein an inert gas fills a region surrounded by the sealing material.

23. A display device according to claim 22 further comprising a light emitting element in which an anode, an organic layer, and a cathode are laminated on the first substrate.

24. A display device according to claim 22, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

25. A display device comprising:

a first substrate;

a second substrate in which at least one concave portion is formed; and a thin film transistor over the first substrate, wherein the second substrate and the first substrate are bonded through a sealing material, wherein the sealing material fills the concave portion of the second substrate, and wherein a resin fills a region surrounded by the sealing material.

26. A display device according to claim 25 further comprising a light emitting element in which an anode, an organic layer, and a cathode are laminated on the first substrate.

27. A display device according to claim 25, wherein the display device is one of the group consisting of a personal computer, a video camera, a portable information terminal, a digital camera, a DVD player, an onboard reverse direction confirmation monitor for a vehicle, a TV telephone, a head-mounted display, a car navigation system, a car audio system, and an electronic amusement device.

* * * * *